United States Patent
Tobita et al.

(10) Patent No.: US 7,289,593 B2
(45) Date of Patent: Oct. 30, 2007

(54) SHIFT REGISTER AND IMAGE DISPLAY APPARATUS CONTAINING THE SAME

(75) Inventors: Youichi Tobita, Tokyo (JP); Hiroyuki Murai, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 83 days.

(21) Appl. No.: 11/258,058

(22) Filed: Oct. 26, 2005

(65) Prior Publication Data

US 2006/0220587 A1    Oct. 5, 2006

(30) Foreign Application Priority Data

Mar. 30, 2005    (JP)    ............... 2005-097263

(51) Int. Cl.
*G11C 19/00*    (2006.01)
(52) U.S. Cl. ............... 377/64; 377/78; 377/79
(58) Field of Classification Search ............ None
See application file for complete search history.

(56) References Cited

U.S. PATENT DOCUMENTS

| | | | |
|---|---|---|---|
| 5,222,082 A | 6/1993 | Plus | |
| 5,949,271 A | 9/1999 | Fujikura | |
| 5,949,398 A * | 9/1999 | Kim | ............ 345/100 |
| 6,928,135 B2 | 8/2005 | Sasaki et al. | |
| 2004/0046729 A1 | 3/2004 | Moon | |
| 2005/0220262 A1* | 10/2005 | Moon | ............ 377/64 |
| 2005/0220263 A1* | 10/2005 | Moon | ............ 377/68 |

FOREIGN PATENT DOCUMENTS

| | | |
|---|---|---|
| JP | 2002-197885 A | 7/2002 |
| JP | 2002-313093 A | 10/2002 |
| JP | 2004-103226 A | 4/2004 |

* cited by examiner

*Primary Examiner*—Tuan T Lam
(74) *Attorney, Agent, or Firm*—Buchanan Ingersoll & Rooney PC

(57) ABSTRACT

A shift register has an output stage formed by a first transistor connected between an output terminal and a first clock terminal and a second transistor connected between the output terminal and a ground. Third and fourth transistors are connected in series between the gate of the first transistor (first node) and the ground. A second node between the third and fourth transistors is connected to a power source via a fifth transistor. The fifth transistor has its gate connected to the first node. Accordingly, when the third and fourth transistors are turned off to raise the first node in level, the fifth transistor is turned on, whereby a predetermined voltage is applied to the second node.

5 Claims, 29 Drawing Sheets

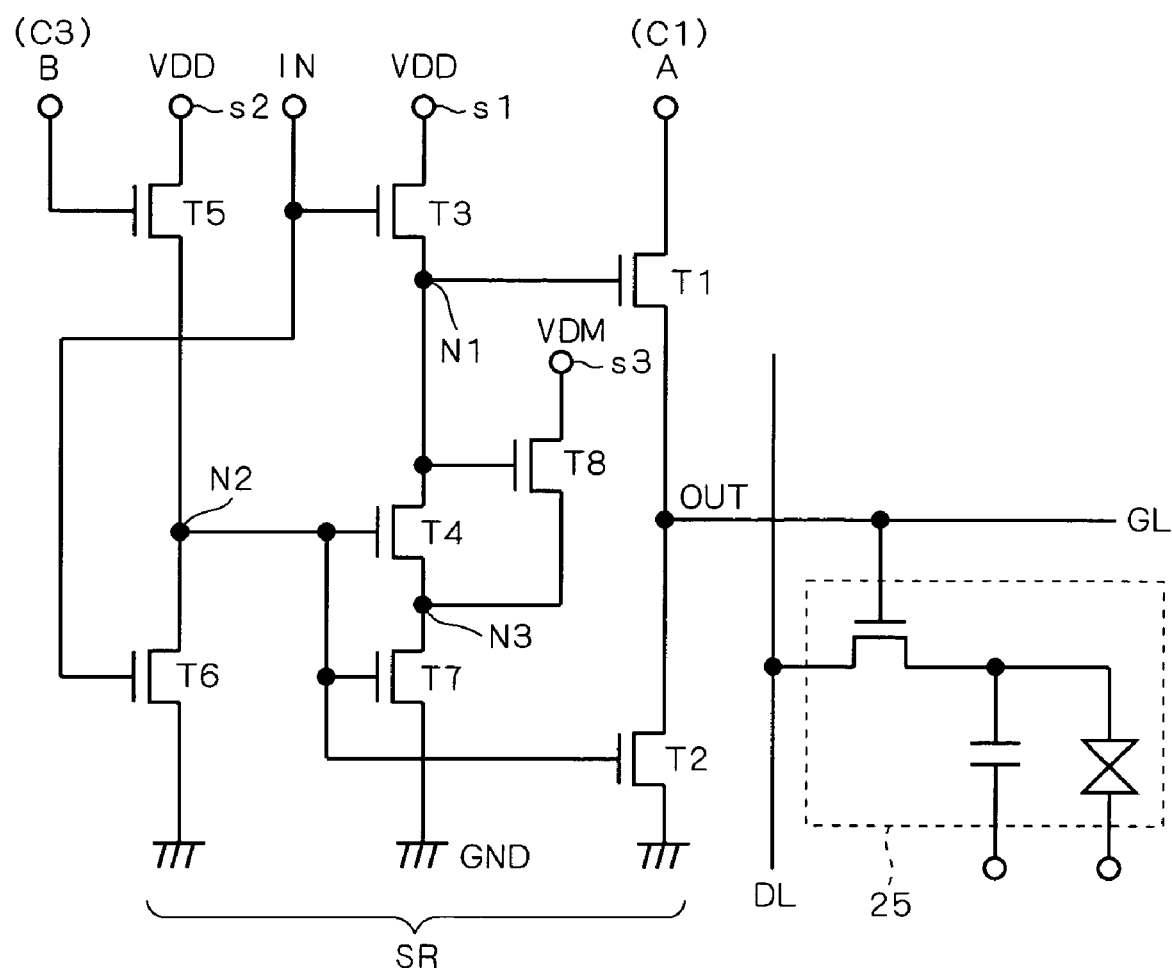
F I G . 3

F I G . 4
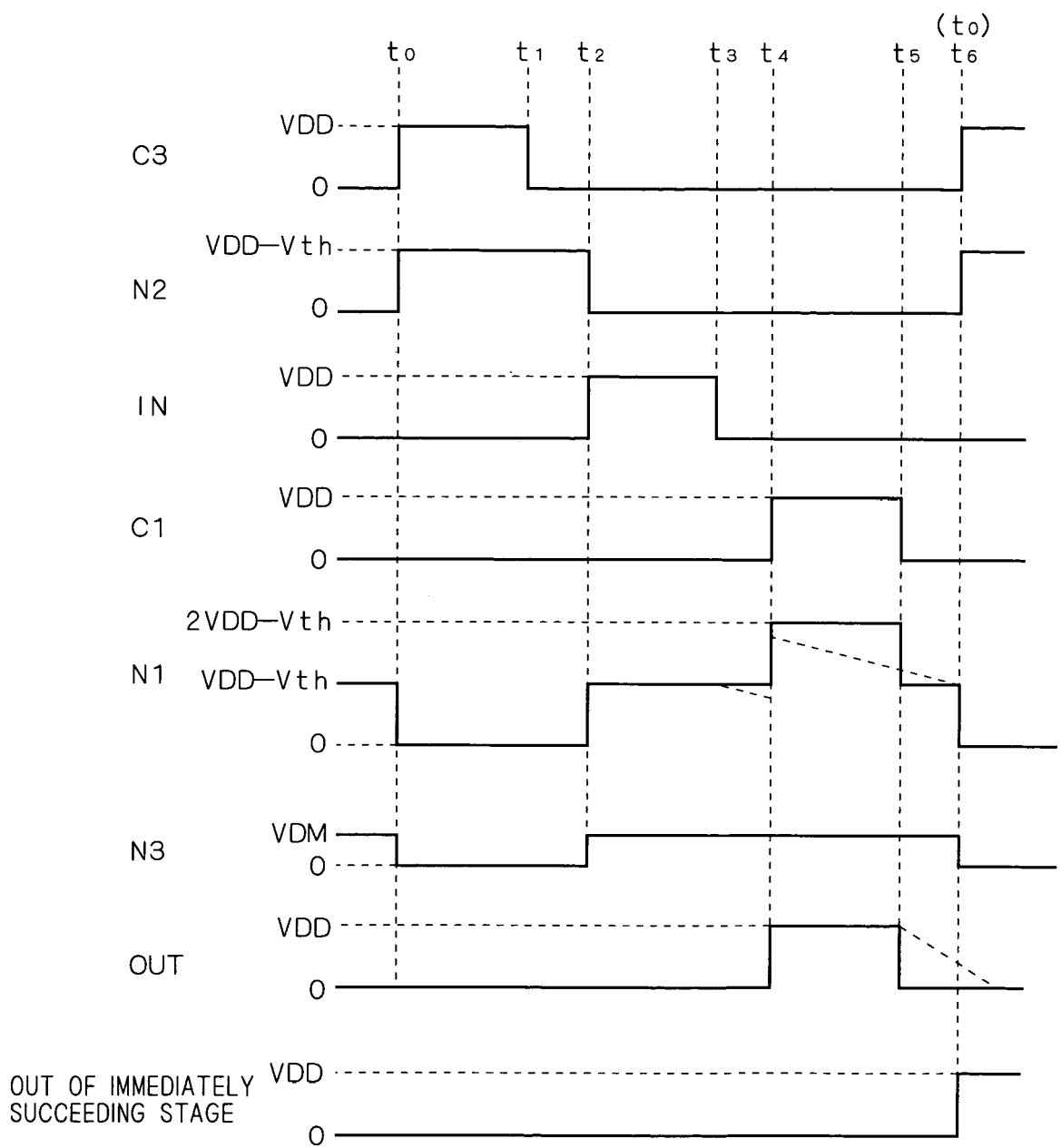

F I G. 1 1
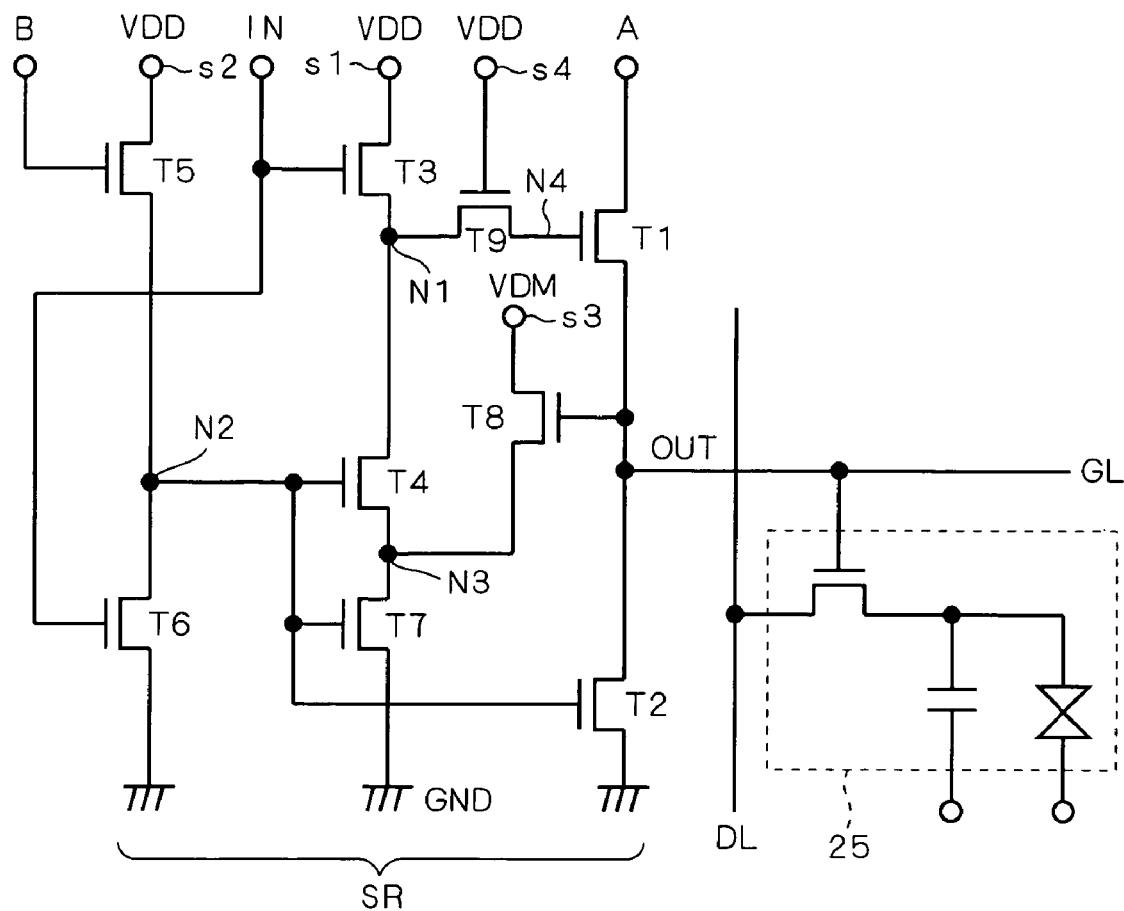

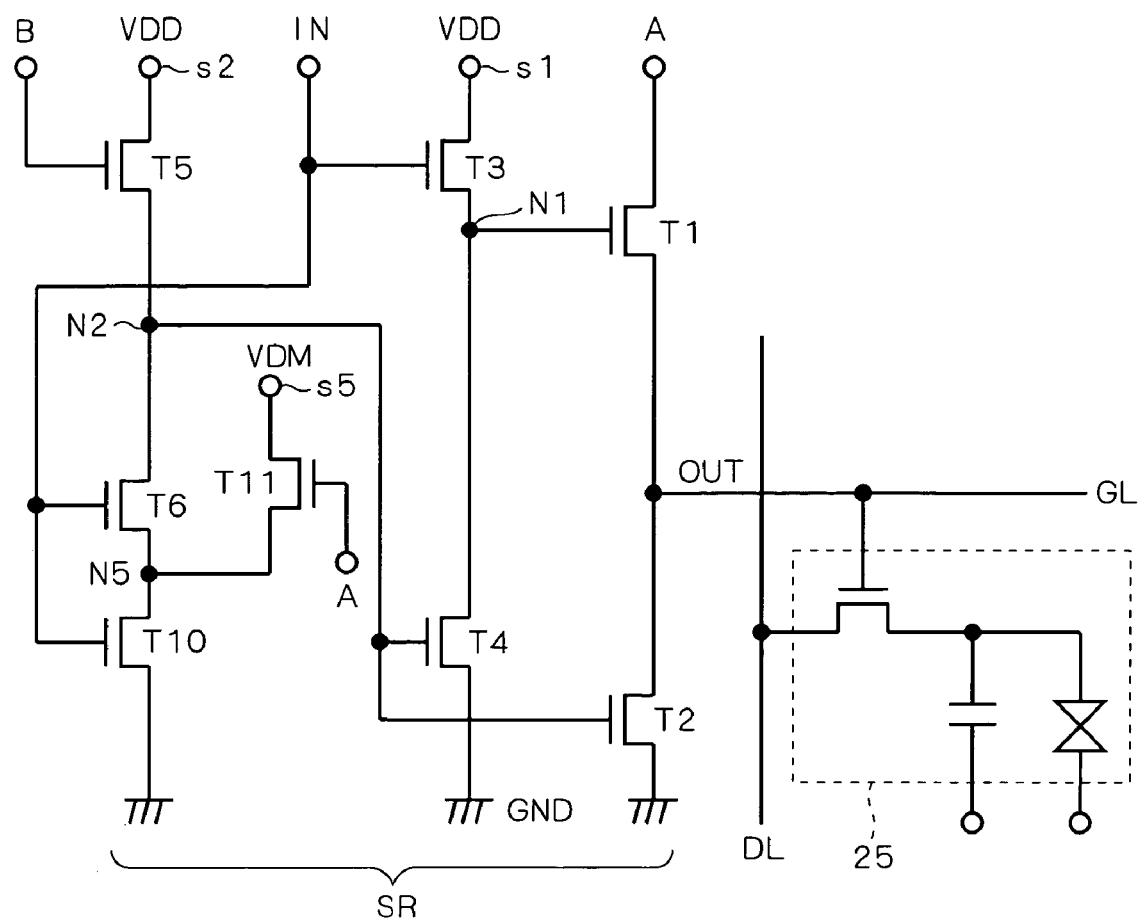
F I G . 1 6

F I G . 1 7
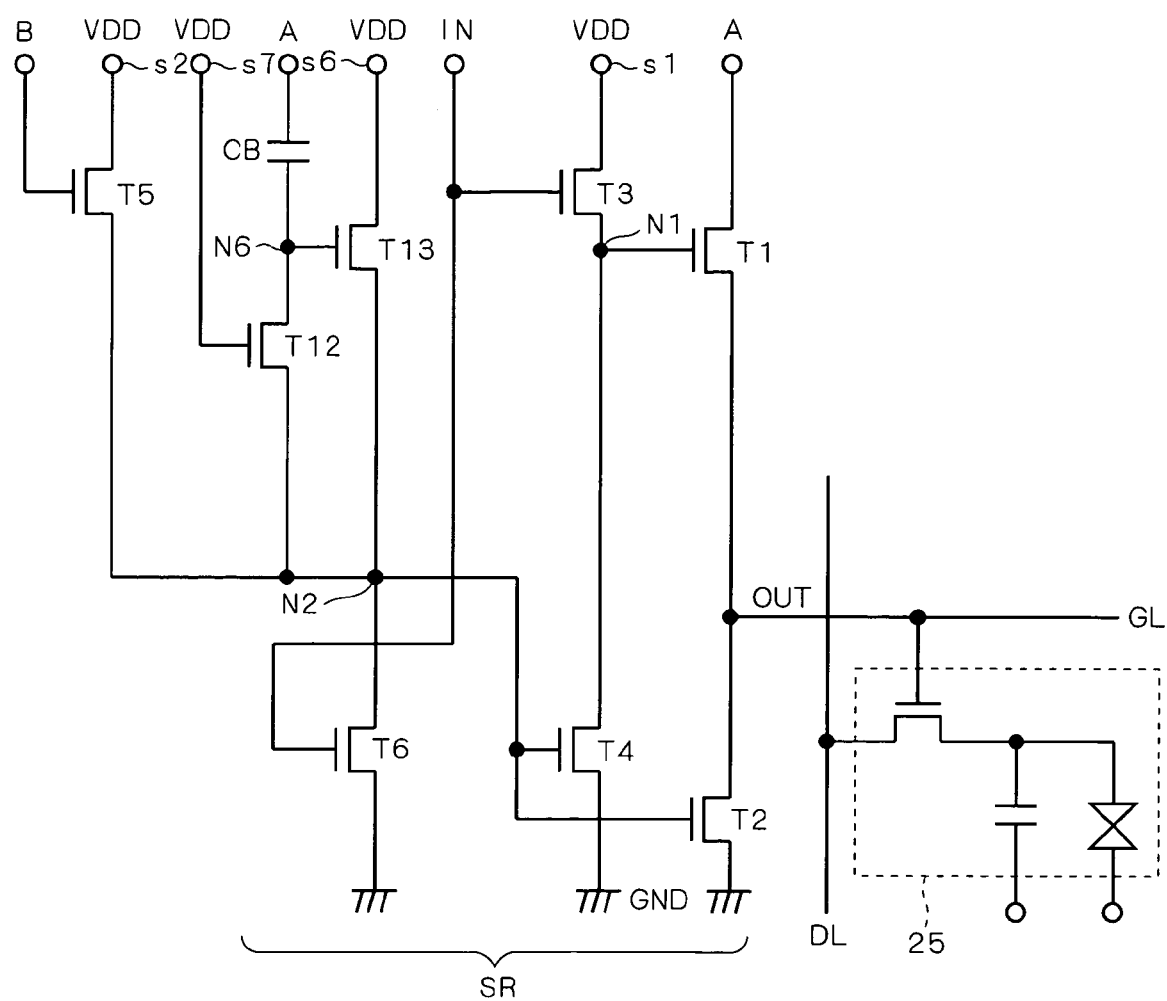

SHIFT REGISTER AND IMAGE DISPLAY APPARATUS CONTAINING THE SAME

BACKGROUND OF THE INVENTION

1. Field of the Invention

The present invention relates to a shift register, and more particularly, to a shift register for use as a scanning-line driving circuit for an image display apparatus or the like, which is formed by field effect transistors of the same conductivity type only.

2. Description of the Background Art

An image display apparatus (hereinafter referred to as a "display apparatus") such as a liquid crystal display includes a display panel in which a plurality of pixels are arrayed in a matrix. A gate line (scanning line) is provided for each row of pixels (pixel line), and gate lines are sequentially selected and driven in a cycle of one horizontal period of a display signal, so that a displayed image is updated. As a gate-line driving circuit (scanning-line driving circuit) for sequentially selecting and driving pixel lines, i.e., gate lines, a shift register for performing a shift operation in one frame period of a display signal can be used.

To reduce the number of steps in the manufacturing process of a display apparatus, such shift register used as the gate-line driving circuit is preferably formed by field effect transistors of the same conductivity type only. Accordingly, various types of shift registers formed by N- or P-type field effect transistors only and display apparatuses containing such shift registers have been proposed (e.g., U.S. Pat. No. 5,222,082, and Japanese Patent Application Laid-Open Nos. 2002-313093, 2002-197885 and 2004-103226). As a field effect transistor, a metal oxide semiconductor (MOS) transistor, a thin film transistor (TFT), or the like is used.

A conventional shift register has a problem caused by a leakage current at a node (specifically, nodes P1 and P2 shown in FIG. 2 of the above-mentioned U.S. Pat. No. 5,222,082) to which a gate electrode of a transistor of an output stage is connected.

For instance, when a leakage current occurs at a gate electrode node (P1) of a transistor connected between an output terminal of a shift register and a clock terminal defining an output signal output from the output terminal, an impedance of the transistor when discharge takes place at the output terminal increases, and the time required for the discharge thus increases. Therefore, the fall time of the output signal increases, causing the output signal to be unable to follow a clock signal input to the clock terminal. As a result, an increased fall time of the output signal in the gate-line driving circuit of a display apparatus causes a problem in that a plurality of gate lines are driven at the same time, resulting in failure to achieve a normal display (which will be described later in detail).

Further, when a leakage current occurs at a gate electrode node (P2) of a transistor connected between the output terminal and a reference voltage terminal of the shift register, an impedance of the transistor in the on state (conducting state) increases. That is, an output impedance of the shift register increases, arising a concern that the potential at the output terminal may become unstable. In the case where the output signal from the gate-line driving circuit thus becomes unstable, the problem of failure to achieve a normal display also arises (which will be described later in detail).

A shift register described in the above-mentioned JP2002-313093 includes inversion-preventing circuits (transistors T7, T8) connected to the gate electrode node (n2) of an NMOS transistor (transistor T2) connected between an output terminal and a power source for stabilizing the potential at the node. The NMOS transistor needs to be held off (cutoff state) in a period during which an output line is in low level. The inversion-preventing circuits prevent the NMOS transistor from unnecessarily turning on due to level transition of the output line during the period in which the output line is in the low level, which solves another problem different from the above-described one.

SUMMARY OF THE INVENTION

An object of the present invention is to provide a shift register capable of preventing a malfunction caused by a leakage current and an image display apparatus containing such shift register.

According to a first aspect of the invention, the shift register includes an input terminal and an output terminal, first and second clock terminals, first, second and third voltage terminals, a first transistor, a second transistor, a first node, a second node and a driving section. First and second clock signals are input to the first and second clock terminals, respectively. The first and second clock signals are shifted in phase from each other. First, second and third voltages are applied to the first, second and third voltage terminals, respectively. The first transistor is connected between the output terminal and the first clock terminal. The second transistor is connected between the output terminal and the first voltage terminal. A control electrode of the first transistor is connected to the first node. A control electrode of the second transistor is connected to the second node. The driving section applies the first voltage to the first node and a voltage corresponding to the third voltage to the second node in synchronization with the second clock signal, while applying a voltage corresponding to the second voltage to the first node and the first voltage to the second node in response to an input signal input to the input terminal. The driving section includes a third transistor for applying the first voltage to the first node, the third transistor having one main electrode connected to the first node and a control electrode connected to the second node. The driving section is configured such that a predetermined voltage other than the first voltage is applied to a third node which is the other main electrode of the third transistor in a period during which the third transistor is in a cutoff state.

It is possible to control a leakage current at the first node of the shift register, which prevents the first node from dropping in voltage level while being charged. As a result, an output signal in an active state of the output terminal is ensured to follow the first clock signal, which achieves an improved operational reliability. Therefore, a display apparatus containing the shift register as a scanning-line driving circuit can achieve a normal display while preventing a malfunction.

According to a second aspect of the invention, the shift register includes an input terminal and an output terminal, first and second clock terminals, first, second and third voltage terminals, a first transistor, a second transistor, a first node, a second node and a driving section. First and second clock signals are input to the first and second clock terminals, respectively. The first and second clock signals are shifted in phase from each other. First, second and third voltages are applied to the first, second and third voltage terminals, respectively. The first transistor is connected between the output terminal and the first clock terminal. The second transistor is connected between the output terminal and the first voltage terminal. A control electrode of the first transistor is connected to the first node. A control electrode of the second transistor is connected to the second node. The driving section applies the first voltage to the first node and a voltage corresponding to the third voltage to the second node in synchronization with the second clock signal, while applying a voltage corresponding to the second voltage to the first node and the first voltage to the second node in response to an input signal input to the input terminal. The driving section includes third and fourth transistors connected in series between the second node and the first voltage terminal, each of the third and fourth transistors having a control electrode connected to the input terminal. The driving section is configured such that a predetermined voltage other than the first voltage is applied to a third node which is a connection node between the third and fourth transistors in a period during which the third and fourth transistors are in a cutoff state.

It is possible to control a leakage current at the second node, which prevents the second node from dropping in voltage level while being charged. Accordingly, an impedance of the second transistor in an inactive state of the output terminal, that is, an output impedance of the shift register is prevented from increasing, which achieves an improved operational reliability. Therefore, a display apparatus containing the shift register as a scanning-line driving circuit can achieve a normal display while preventing a malfunction.

According to a third aspect of the invention, the shift register includes an input terminal and an output terminal, first and second clock terminals, first, second and third voltage terminals, a first transistor, a second transistor, a first node, a second node and a driving section. First and second clock signals are input to the first and second clock terminals, respectively. The first and second clock signals are shifted in phase from each other. First, second and third voltages are applied to the first, second and third voltage terminals, respectively. The first transistor is connected between the output terminal and the first clock terminal. The second transistor is connected between the output terminal and the first voltage terminal. A control electrode of the first transistor is connected to the first node. A control electrode of the second transistor is connected to the second node. The driving section applies the first voltage to the first node and a voltage corresponding to the third voltage to the second node in synchronization with the second clock signal, while applying a voltage corresponding to the second voltage to the first node and the first voltage to the second node in response to an input signal input to the input terminal. The driving section includes a compensation circuit for charging the second node to a level at which a conducting state of the second transistor is kept in synchronization with the first clock signal during a period in which the second transistor is in the conducting state.

A leakage current, if occurred at the second node having been charged, is compensated for in an inactive state of the output terminal, which brings the second transistor into the conducting state. Accordingly, an impedance of the second transistor in an inactive state of the output terminal, that is, an output impedance of the shift register is prevented from increasing, which achieves an improved operational reliability. Therefore, a display apparatus containing the shift register as a scanning-line driving circuit can achieve a normal display while preventing a malfunction.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram illustrating the configuration of a unit shift register according to the first preferred embodiment;

FIG. 4 is a timing chart showing an operation of the unit shift register according to the first preferred embodiment;

FIG. 11 is a circuit diagram illustrating the configuration of a unit shift register according to a fourth preferred embodiment of the invention;

FIG. 16 is a circuit diagram illustrating the configuration of a unit shift register according to a seventh preferred embodiment of the invention;

FIG. 17 is a circuit diagram illustrating the configuration of a unit shift register according to an eighth preferred embodiment of the invention;

DESCRIPTION OF THE PREFERRED EMBODIMENTS

Figure 1:
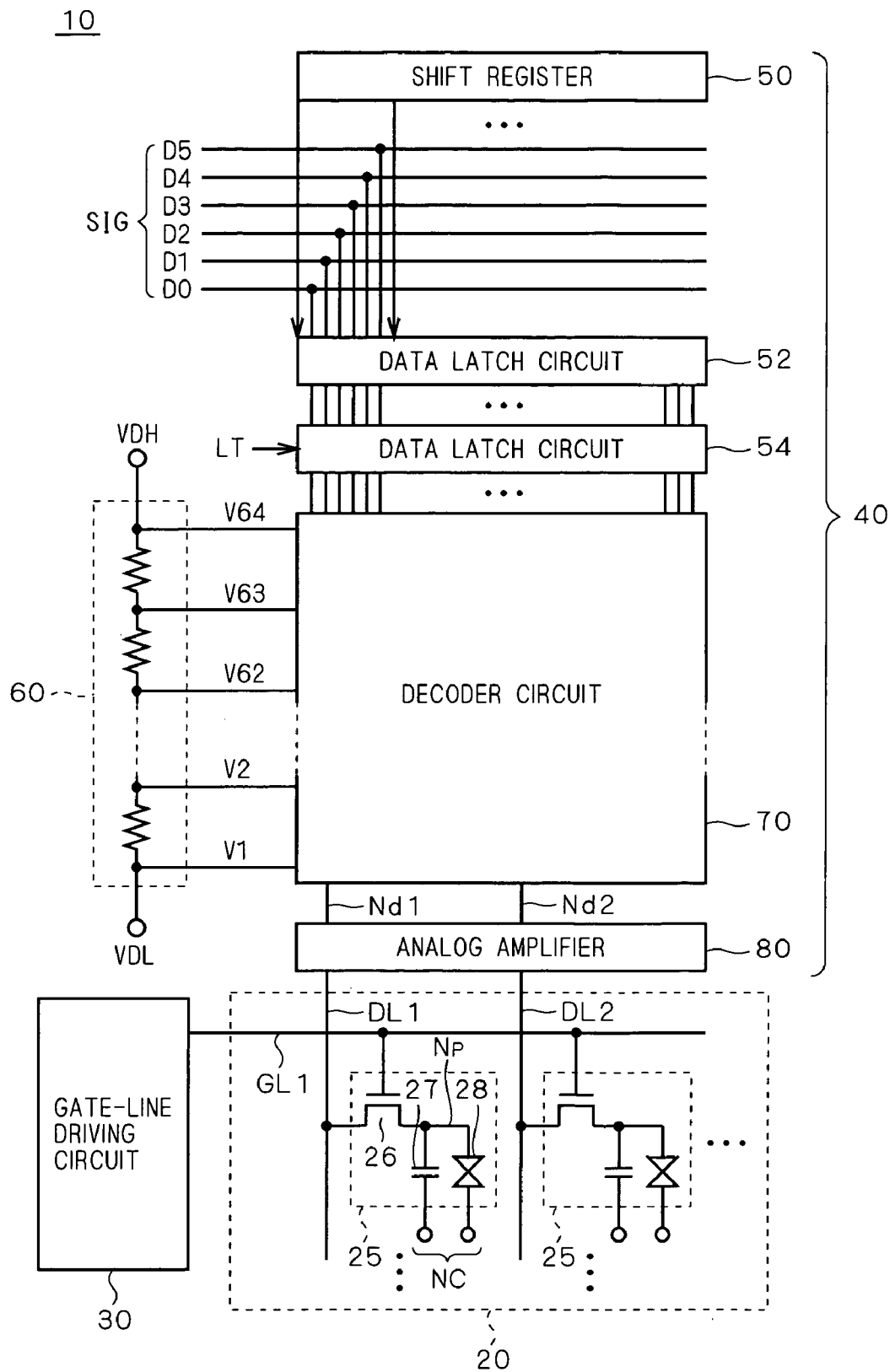
FIG. 1 is a schematic block diagram illustrating the configuration of a display apparatus according to the present invention.

Preferred embodiments of the present invention will be described hereinbelow referring to the accompanied drawings. To avoid repeated and redundant description, elements having the same or corresponding functions are indicated by the same reference characters in the drawings.

First Preferred Embodiment

FIG. 1 is a schematic block diagram illustrating the configuration of a display apparatus according to the present invention. The overall configuration of a liquid crystal display 10 is shown as an representative example of the display apparatus.

The liquid crystal display 10 is provided with a liquid crystal array part 20, a gate-line driving circuit (scanning-line driving circuit) 30 and a source driver 40. As will be described later explicitly, a shift register according to the present embodiment is mounted on the gate-line driving circuit 30.

The liquid crystal array part 20 includes a plurality of pixels 25 arrayed in a matrix. The columns of pixels (hereinafter also referred to as "pixel lines") are respectively provided with gate lines GL1, GL2, . . . (hereinafter also generically referred to as a "gate line GL"), and the rows of pixels (hereinafter also referred to as "pixel rows") are respectively provided with data lines DL1, DL2, . . . (hereinafter generically referred to as a "data line DL"). FIG. 1 representatively shows pixels 25 of the first and second rows in the first column and corresponding gate line GL1 and data lines DL1 and DL2.

Each pixel 25 has a pixel switching device 26 disposed between a corresponding data line DL and a pixel node Np, and a capacitor 27 and a liquid crystal display device 28 connected in parallel between the pixel node Np and a common electrode node NC. The crystal orientation in the liquid crystal display device 28 changes depending on the potential difference between the pixel node Np and common electrode node NC, and in response to this change, the display luminance of the liquid crystal display device 28 changes. Accordingly, the luminance of each pixel 25 can be controlled by a display voltage transmitted to the pixel node Np via the data line DL and pixel switching device 26. In other words, an intermediate potential difference between a potential difference corresponding to the maximum luminance and a potential difference corresponding to the minimum luminance is applied between the pixel node Np and common electrode node NC, whereby halftone luminance can be obtained. Therefore, setting display voltages stepwise, grayscale luminance can be obtained.

The gate-line driving circuit 30 sequentially selects and drives a gate line GL in a predetermined scanning cycle. Each pixel switching device 26 has its gate electrode connected to a corresponding gate line GL. While a certain gate line GL is selected, the pixel switching device 26 is brought into the conducting state in each pixel 25 connected to the selected gate line GL, whereby the pixel node Np is connected to a corresponding data line DL. Then, the display voltage transmitted to the pixel node Np is held by the capacitor 27. Generally, the pixel switching device 26 is constructed from a TFT formed on a substrate of the same insulator as the liquid crystal display device 28 (a glass substrate, a resin substrate or the like).

The source driver 40 is provided to output display voltages set stepwise by a display signal SIG which is an N-bit digital signal, to the data line DL. As an example, the display signal SIG is assumed to be a 6-bit signal including display signal bits D0 to D5. With such 6-bit display signal SIG, $2^6=64$ levels of gray can be displayed in each pixel 25. Further, a display of approximately 260 thousand colors can be achieved by forming one color display unit by three pixels of R (Red), G (Green) and B (Blue).

As shown in FIG. 1, the source driver 40 includes a shift register 50, data latch circuits 52, 54, a gradation voltage generating circuit 60, a decoder circuit 70 and an analog amplifier 80.

In the display signal SIG, the display signal bits D0 to D5 corresponding to the display luminance of respective pixels 25 are serially generated. In other words, each of the display signal bits D0 to D5 at each timing indicates the display luminance of any one pixel 25 in the liquid crystal array part 20.

The shift register 50 gives an instruction to the data latch circuit 52 to capture the display signal bits D0 to D5 in synchronization with a cycle during which the settings of the display signal SIG are changed. The data latch circuit 52 sequentially captures serially-generated display signals SIG to latch display signals SIG for one pixel line.

A latch signal LT input to the data latch circuit 54 is activated with timing when display signals SIG for one pixel line are captured by the data latch circuit 52. In response to this, the data latch circuit 54 captures the display signals SIG for one pixel line latched by the data latch circuit 52 at that time.

The gradation voltage generating circuit 60 is formed by 63 resistor dividers connected in series between a high voltage VDH and a low voltage VDL, for generating 64 levels of gradation voltages V1 to V64, respectively.

The decoder circuit 70 decodes display signals SIG latched by the data latch circuit 54, and based on the result of decoding, selects voltages to be respectively output to decoder output nodes Nd1, Nd2, . . . (generically referred to as a "decoder output node Nd") from among the gradation voltages V1 to V64, and outputs the selected voltages.

As a result, display voltages (selected from among the gradation voltages V1 to V64) corresponding to the display signals SIG for one pixel line latched by the data latch circuit 54 are output to the decoder output node Nd at the same time (in parallel). FIG. 1 representatively shows the decoder output nodes Nd1 and Nd2 corresponding to the data line DL1 of the first row and the data line DL2 of the second row, respectively.

The analog amplifier 80 outputs analog voltages corresponding to display voltages output from the decoder circuit 70 to the decoder output nodes Nd1, Nd2, . . . , to the data lines DL1, DL2, . . . , respectively.

The source driver 40 repeatedly outputs display voltages corresponding to a series of display signals SIG for one pixel line to the data line DL in a predetermined scanning cycle, and the gate-line driving circuit 30 sequentially drives the gate lines GL1, GL2, . . . in synchronization with the scanning cycle. Accordingly, image display based on the display signals SIG is provided on the liquid crystal array part 20.

FIG. 1 shows an example of the liquid crystal display 10 with the gate-line driving circuit 30 and source driver 40 formed integrally with the liquid crystal array part 20, however, the gate-line driving circuit 30 and source driver 40 may be provided as an external circuit of the liquid crystal array part 20.

Figure 2:
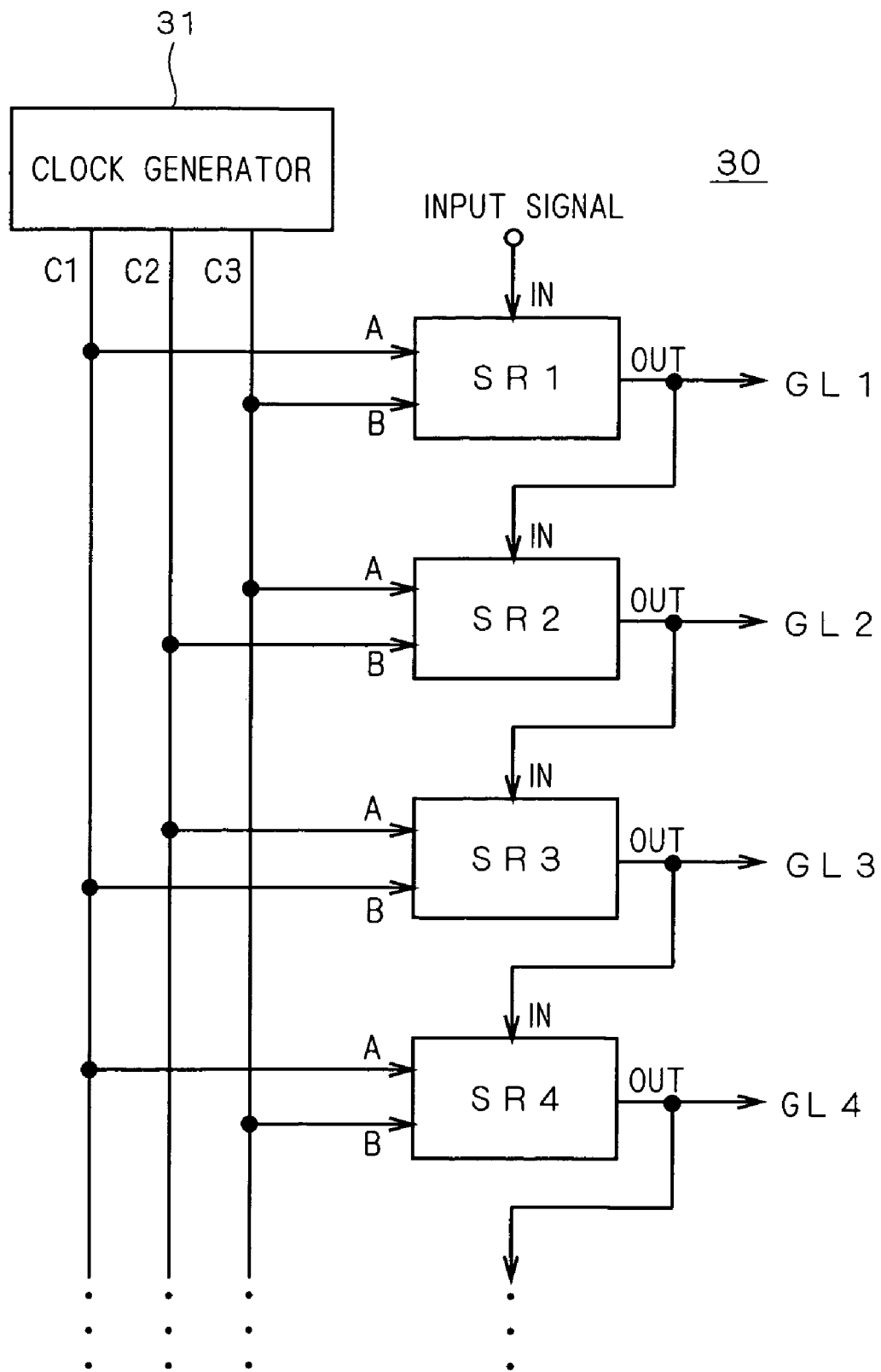
FIG. 2 is a block diagram illustrating the configuration of a gate-line driving circuit of the display apparatus according to a first preferred embodiment of the invention.

The configuration of the gate-line driving circuit 30 according to the present invention will now be described in detail. FIG. 2 shows the configuration of the gate-line driving circuit 30 according to the present embodiment. The gate-line driving circuit 30 includes a plurality of shift registers SR1, SR2, SR3, SR4, . . . connected in cascade (for ease of description, each of the cascaded shift registers SR1, SR2, . . . will generically be called a "unit shift register SR"). Each unit shift resister SR is provided for one pixel line, i.e., each gate line GL.

A clock generator 31 shown in FIG. 2 is provided to input three phase clock signals C1, C2 and C3, shifted in phase with each other, to the unit shift register SR of the gate-line driving circuit 30. The clock signals C1, C2 and C3 are controlled to be sequentially activated in synchronization with the scanning cycle of the display apparatus.

Each unit shift register SR includes an input terminal IN, an output terminal OUT, and first and second clock terminals A and B. As shown in FIG. 2, two of the clock signals C1, C2 and C3 output from the clock generator 31 are supplied to the clock terminals A and B of each unit shift register SR, respectively. An input signal called a start pulse is input to the input terminal IN of the unit shift register SR1 of the first stage. Input to the input terminal IN of each of the unit shift registers SR of the second and following stages is an output signal output to the output terminal OUT of the immediately preceding stage. The output signal of each unit shift register SR is output to the gate line GL as a horizontal (or vertical) scanning pulse.

With the gate-line driving circuit 30 of such configuration, each unit shift register SR outputs an input signal received from the immediately preceding stage (output signal of the immediately preceding stage) to a corresponding gate line GL and a unit shift register SR of the immediately succeeding stage while shifting the input signal in synchronization with the clock signals C1, C2 and C3 (the operation of the unit shift register SR will be described later in detail). As a result, a series of unit shift registers SR serve as a so-called gate-line driving unit for sequentially activating gate lines GL with timing based on the predetermined scanning cycle.

FIG. 3 is a circuit diagram illustrating the configuration of the unit shift register SR according to the present embodiment. As the respective unit shift registers SR have substantially the same configuration, the configuration of one unit shift register SR will be representatively described hereinbelow. Transistors constituting the unit shift register SR shall be field effect transistors of the same conductivity type, and in the present embodiment, all the transistors shall be N-type TFTs.

The unit shift register SR includes the input terminal IN, output terminal OUT, a first clock terminal A, second clock terminal B, a reference voltage terminal serving as a first voltage terminal to which a first voltage is applied, a first power terminal s1 serving as a second voltage terminal to which a predetermined second voltage is applied and a second power terminal s2 serving as a third voltage terminal to which a predetermined third voltage is applied. The present embodiment illustrates a case in FIG. 3 in which, assuming the voltage on the shift register side as a reference for ease of description, the reference voltage terminal is connected to a ground GND (0V) and the first and second power terminals s1 and s2 are both connected to a power source VDD (that is, the first voltage is 0V, and the second and third voltages are the source voltage VDD in this embodiment). In practical use, the voltage on the pixel side is assumed as a reference, and in the example of FIG. 3, a voltage of 17V is applied to the first and second power terminals s1 and s2 and a voltage of –12V is applied to the reference voltage terminal (that is, in this practical example, the first voltage is –12V, and the second and third voltages are the source voltage of 17V). In other words, the present embodiment will describe that the unit shift register SR operates such that a corresponding gate line GL is at the source voltage VDD when selected and 0V when not selected, however, in practical use, the unit shift register SR operates such that a corresponding gate line GL is in a positive level (e.g., 17V) when selected and negative level (e.g., –12V) when not selected.

The output stage of the unit shift register SR is formed by a transistor T1 (first transistor) connected between the output terminal OUT and first clock terminal A and a transistor T2 (second transistor) connected between the output terminal OUT and ground GND (reference voltage terminal). As shown in FIG. 3, the transistor T1 has its gate (control electrode) connected to a node N1 (first node), and the transistor T2 has its gate connected to a node N2 (second node). A transistor T3 is connected between the node N1 and first power terminal s1 (power source VDD), and transistors T4 and T7 are connected in series between the node N1 and ground GND.

The transistors T4 and T7 are provided to apply a reference voltage (the ground voltage GND) to the node N1. As shown in FIG. 3, the transistor T4 has its drain which is one main electrode connected to the node N1 and its source which is the other main electrode connected to the transistor T7. The transistor T7 is connected between a node N3 and ground GND. The transistors T4 and T7 have their gates connected in common to the node N2. A node for the source of the transistor T4 (here, a connection node between the transistors T4 and T7) is defined as the node N3.

The unit shift register SR further includes a third power terminal s3, and a transistor T8 is connected between the third power terminal s3 and node N3. In the present embodiment, a predetermined power source VDM is connected to the third power terminal s3, and the transistor T8 has its gate connected to the node N1. That is, the transistor T8 is turned on when the node N1 rises in level to apply the voltage at the third power terminal s3 (output voltage from power source VDM) to the node N3.

A transistor T5 is connected between the node N2 and second power terminal s2 (power source VDD), and a transistor T6 is connected between the node N2 and ground GND (reference voltage terminal). The input terminal IN is connected to the gates of the transistors T3 and T6, and the second clock terminal B is connected to the gate of the transistor T5. The unit shift register SR according to the present embodiment is configured as described above.

As will be apparent from the above-mentioned U.S. Pat. No. 5,222,082 and JP2002-313093, a conventional unit shift register has only one transistor connected between the node N1 and reference voltage terminal (ground GND) (cf. transistor 19 shown in FIG. 2 of U.S. Pat. No. 5,222,082). In other words, the conventional unit shift register is configured such that the transistor T4 has its source (node N3) directly connected to the ground GND removing the transistors T7 and T8 from the circuit shown in FIG. 3 of the present application.

In the present embodiment, the transistors T3 to T8 constitute a driving section for driving the unit shift register SR. This driving section applies the voltage at the reference voltage terminal (ground GND) to the node N1 and the voltage at the second power terminal s2 (power source VDD) to the node N2 in synchronization with a clock signal input to the second clock terminal B, while applying the voltage at the first power terminal s1 (power source VDD) to the node N1 and the voltage at the reference voltage terminal (ground GND) to the node N2 in response to an input signal input to the input terminal IN. The operation of the unit shift register SR according to the present embodiment including this driving section will now be described specifically.

FIG. 4 is a timing chart showing a normal operation of the unit shift register SR according to the present embodiment. Here, it is assumed that the clock signal C1 is input to the first clock terminal A of the unit shift register SR and the clock signal C3 is input to the second clock terminal B (this case corresponds to, e.g., the unit shift registers SR1 and SR4 shown in FIG. 2). The voltage level (hereinafter briefly referred to as a "level") output from the power sources VDD and VDM will hereinafter be indicated as "VDD" (VDD>0) and "VDM" (VDM>0), respectively.

As shown in FIG. 4, when the clock signal C3 (at the second clock terminal B) transitions from 0V to VDD at time $t_0$, then, the transistor T5 is turned on (conducting state). At this time, the input terminal IN is at 0V and thus, the transistor T6 is held off (cutoff state). Thus, the node N2 is charged to VDD−Vth (Vth: threshold voltage of transistor). Then, the transistors T4 and T7 are both turned on, and the nodes N1 and N3 transition to 0V. Following the transition of the node N1 to 0V, the transistors T1 and T8 are turned off.

As described, when the driving section applies the source voltage VDD to the node N1 and the ground voltage GND to the node N2, the transistor T1 is turned off and the transistor T2 is turned on, which brings the gate line GL into an inactive state (non-selective state) having a low impedance.

Next, when the clock signal C3 returns to 0V at time $t_1$, the transistor T5 is turned off, while the transistor T6 is held off. Thus, the node N2 is kept at VDD−Vth.

At time $t_2$ when an input signal is input to the input terminal IN, the input terminal IN transitions to VDD, and the transistors T3 and T6 are then turned on. Accordingly, the node N2 is discharged to transition to 0V, and the transistors T2, T4 and T7 are turned off. As the transistor T3 is on, the node N1 is charged this time to VDD−Vth. Accordingly, the transistor T1 is turned on (since VDD>>Vth generally holds, VDD−Vth>Vth holds).

As described, when the driving section applies the ground voltage GND to the node N1 and the source voltage VDD to the node N2, the transistor T1 is turned on and the transistor T2 is turned off. At this time, the output terminal OUT does not transition from 0V since the clock signal C1 (at the first clock terminal A) is 0V. That is, the gate line GL remains in the inactive state having a low impedance at this point of time.

In the present embodiment, the transistor T8 is also turned on at this time, and the source voltage VDM is applied to the node N3. The source voltage VDM is assumed to be at such a level that the transistor T8 operates in a non-saturation region. In this case, the node N3 transitions to VDM (when VDM is at such a level that the transistor T8 operates in a saturation region, the node N3 transitions to VDD−2×Vth).

When the input terminal IN returns to 0V at time $t_3$, the transistors T3 and T6 are turned off, however, the transistors T4 and T7 are held off, causing the node N1 to be kept at VDD−Vth (where a leakage current is disregarded).

Next, at time $t_4$, the clock signal C1 input to the first clock terminal A transitions from 0V to VDD. The capacitive coupling caused by the gate-to-channel capacitance of the transistor T1 raises the node N1 to 2×VDD−Vth with the rising of the clock signal C1. During the rising of the clock signal C1, the gate-to-source voltage of the transistor T1 is kept at VDD−Vth, which means the transistor T1 has a low impedance. Therefore, the output terminal OUT is charged substantially at the same time with the rising of the clock signal C1. In other words, the output signal from the output terminal OUT rises following the rising of the clock signal C1, allowing the gate line GL to be activated or selected. Since the gate-to-source voltage of the transistor T1 at this time satisfies the conditions for the transistor T1 to operate in a non-saturation region, a voltage drop by the threshold voltage (Vth) does not occur in the transistor T1, and the output terminal OUT transitions to the same level (VDD) as the clock signal C1.

The node N1 is kept at 2×VDD−Vth until time $t_5$ at which the clock signal C1 returns to 0V (where a leakage current is disregarded). Therefore, the transistor T1 has a low impedance while the clock signal C1 drops in level, and the output terminal OUT drops in level with the falling of the clock signal C1. At this time, the node N1 drops from 2×VDD−Vth by VDD to VDD−Vth. Therefore, the transistor T1 is held on, and the gate line GL is brought into the inactive state having a low impedance.

At time $t_6$ and thereafter, the above-described operation is repeated. The gate-line driving circuit 30 needs to be operated such that gate lines GL are sequentially activated one by one in a cycle of one frame period. Therefore, an input signal is input to each unit shift register SR once in one frame period. Although the operation when an input signal is input to the input terminal IN has been described above, the clock signals C1 and C2 are continuously input in a certain cycle to the first and second clock terminals A and B, respectively, during a period in which no input signal is input. Thus, the node N2 is charged repeatedly each time the transistor T5 is turned on in response to the clock signal C3 to keep VDD−Vth, so that the node N1 is kept at 0V. That is, during the period in which no signal is input, the transistors T1 and T2 of output stage are held off and on, respectively, so that the corresponding gate line GL is kept in the inactive state having a low impedance.

Summarizing the above-described operation, in the unit shift register SR, the node N2 is kept at VDD−Vth during the period in which no signal is input to the input terminal IN, whereby the output terminal OUT (gate line GL) is kept at 0V having a low impedance. When a signal is input to the input terminal IN, the node N2 transitions to 0V while the node N1 is charged to VDD−Vth. Next, when the clock signal C1 is input to the first clock terminal A, the node N1 rises to 2×VDD−Vth, and the output terminal OUT transitions to VDD, allowing the gate line GL to be activated (the node N1 may thus be referred to as a "step-up node"). Thereafter, when the clock signal C3 is input to the second clock terminal B, the node N2 is reset to VDD−Vth again, and the node N1 is also reset to 0V, so that an original state is brought about (the node N2 will thus be referred to as a "reset node" as well).

Figure 5:
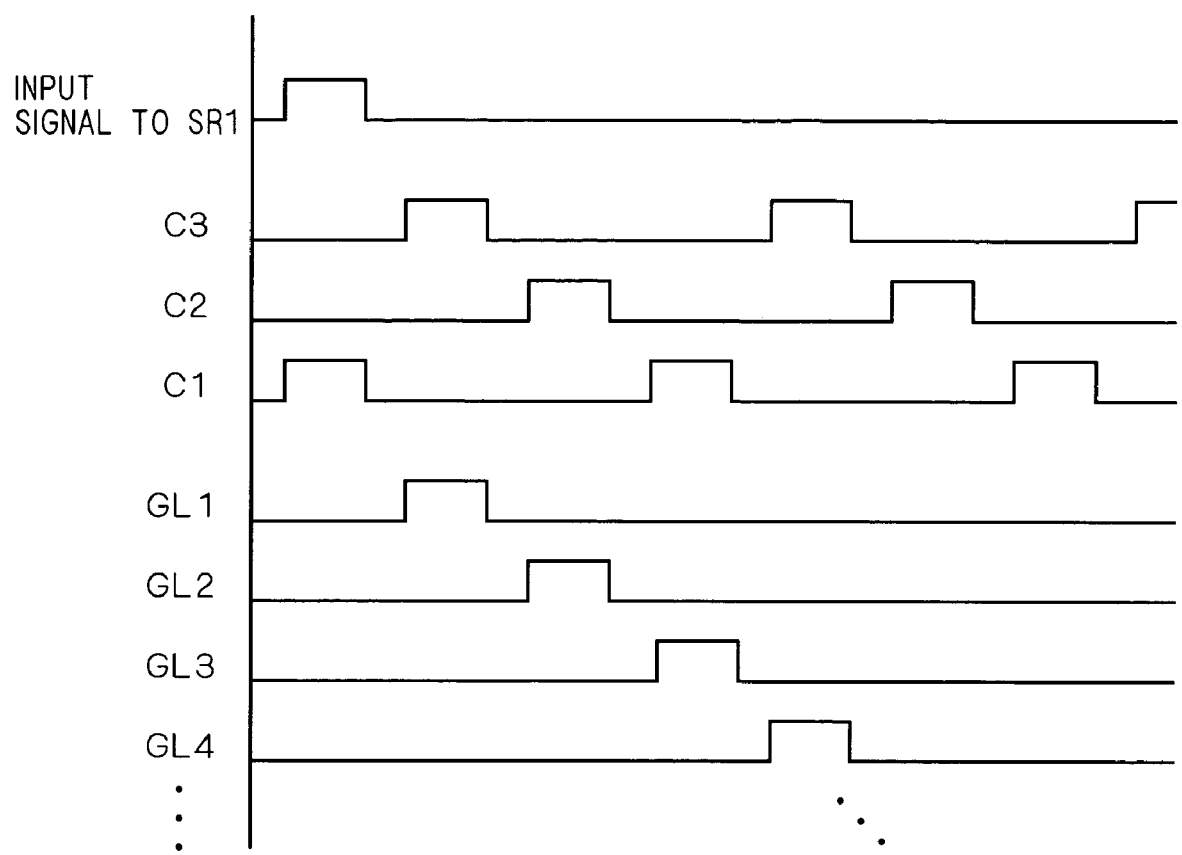
FIG. 5 is a timing chart showing an operation of the gate-line driving circuit of the display apparatus according to the first preferred embodiment.

Connecting in cascade a plurality of unit shift registers SR operating as described above as shown in FIG. 2 to constitute the gate-line driving circuit 30, the input signal input to the input terminal IN of the unit shift register SR1 of first stage is transferred sequentially to the unit shift registers SR2, SR3, . . . while being shifted in synchronization with the clock signals C1, C2 and C3 as shown in a timing chart of FIG. 5. Accordingly, the gate-line driving circuit 30 is capable of driving the gate lines GL1, GL2, GL3, . . . sequentially in a predetermined scanning cycle.

The voltage waveforms indicated by solid lines in FIG. 4 show ideal waveforms in the case where no leakage current occurs at the node N1. When a leakage current occurs at the node N1, the voltage waveforms at the node N1 and output terminal OUT become those indicated by dotted lines in FIG. 4. That is, the level at the node N1 drops with time after time $t_3$ at which the transistor T3 is turned off. Therefore, the transistor T1 has a high impedance at time $t_5$ at which the clock signal C1 drops in level, so that the voltage drop at the output terminal OUT does not follow the falling of the clock signal C1. That is, the level transition at the output terminal OUT from VDD to 0V takes time, which in turn increases a rise time of the output signal, i.e., a driving signal for the gate line GL.

As shown in the lowermost position in FIG. 4, the output terminal OUT of the unit shift register SR of the immediately succeeding stage is activated at time $t_6$. Accordingly, a plurality of adjacent gate lines GL are selected at the same time when the rise time of the output signal increases, resulting in failure to achieve a normal display. As described earlier, the conventional unit shift register having only one transistor connected between the node N1 and ground GND causes this problem when a leakage current occurs in the transistor.

In contrast, according to the present embodiment, the two transistors T4 and T7 are connected in series between the node N1 and ground GND, and the transistor T8 connected to the power source VDM is connected to the node N3 between the transistors T4 and T7, as shown in FIG. 3. Since the gates of the transistors T4 and T7 are connected in common to the node N2, the transistors T4 and T7 are switched on/off with the same timing. Since the gate of the transistor T8 is connected to the node N1, the transistor T8 is turned on when the node N1 is at a high level (that is, when the transistors T4 and T7 are held off).

Accordingly, when the transistors T4 and T7 are turned off and the node N1 transitions to VDD−Vth at time $t_2$ shown in FIG. 4 as described above, the transistor T8 is turned on, and the node N3 transitions to VDM. Focusing attention on the transistor T4 at this time, the gate (node N2) is at 0V, the drain (node N1) is at VDD−Vth, and the source (node N3) is at VDM (>0V). Therefore, the gate of the transistor T4 is negative biased with respect to the source (this state will hereinafter be referred to as a "negative-biased state"). This negative-biased state of the transistor T4 continues until the node N1 is reset to 0V (until time $t_6$ shown in FIG. 4). As a result, the transistor T4 is in the negative-biased state during the period in which the node N1 is charged (from time $t_2$ to time $t_6$).

Figure 6:
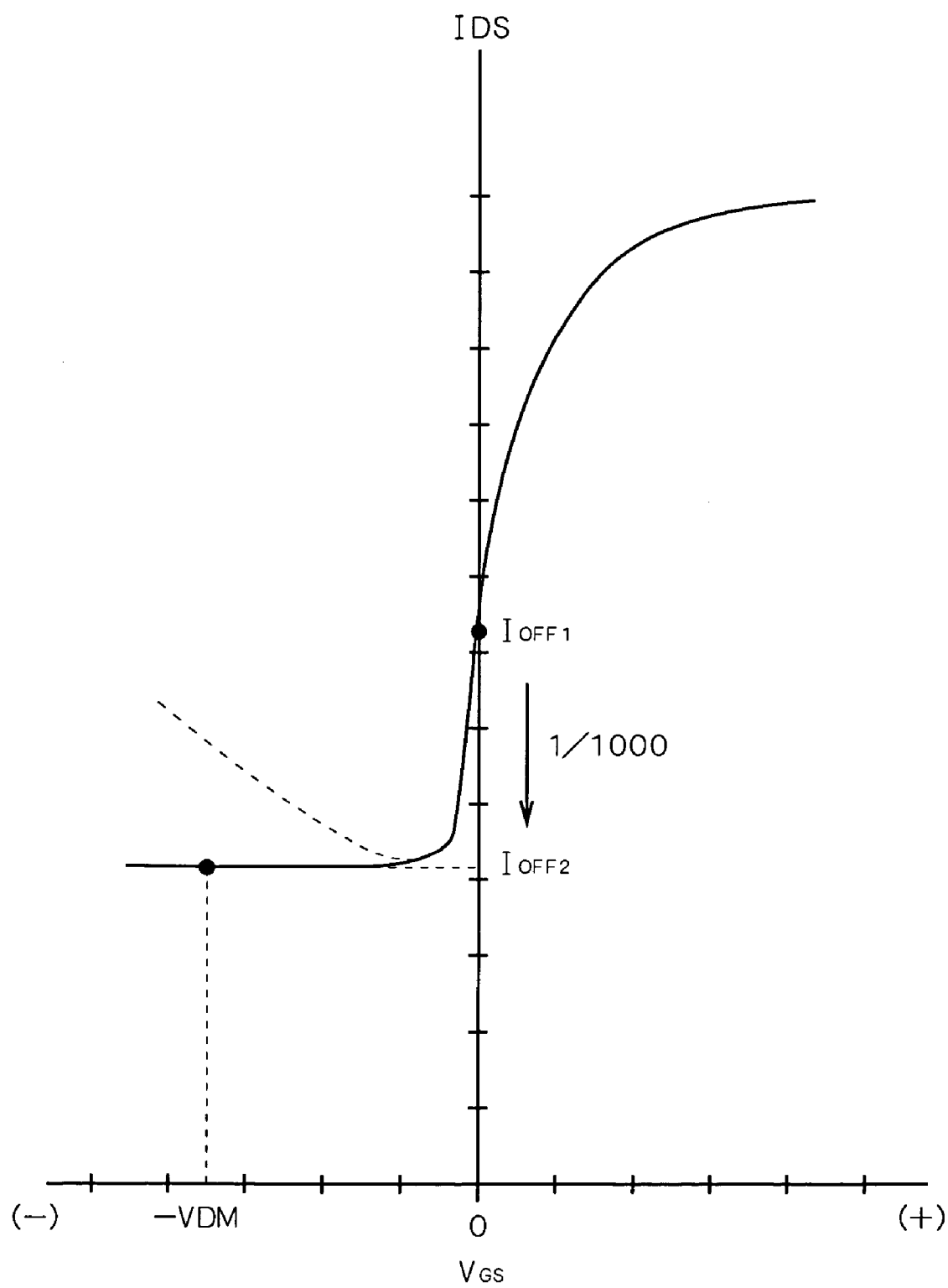
FIG. 6 is a graph showing the effects achieved by the first preferred embodiment.

FIG. 6 is a graph showing the relationship between the gate-to-source voltage ($V_{GS}$) and drain-to-source current ($I_{DS}$) in a general N-type transistor. In FIG. 6, the vertical axis ($I_{DS}$) indicates a logarithmic scale. The N-type transistor is off when $V_{GS}=0$ holds, however, as seen from FIG. 6, a leakage current $I_{OFF1}$ occurs when $V_{GS}=0$ holds. Particularly, the leakage current $I_{OFF1}$ is relatively high when $V_{GS}=0$ holds in an amorphous TFT for use in a display apparatus, and further tends to increase by one order of magnitude or more as compared to a usual case under the influence of a backlight for image display.

In the case of the conventional unit shift register, as the source of the single transistor connected between the node N1 and ground GND is at the ground voltage GND, the gate-to-source voltage in the off state is 0V. Therefore, the conventional unit shift register arises the above-mentioned problem resulting from the leakage current $I_{OFF1}$ occurred in the single transistor.

In contrast, the transistor T4 of the unit shift register SR according to the present embodiment is negative biased ($V_{GS}<0$) in the off state. Assuming that $V_{GS}<0$ holds in an N-type transistor, a leakage current $I_{OFF2}$ at that time becomes approximately 1/1000 times the leakage current $I_{OFF1}$ at the time when $V_{GS}=0$ holds.

Accordingly, the unit shift register SR according to the present embodiment reduces a leakage current in the transistor T4 (i.e., leakage current at the node N1), allowing the node N1 to be prevented from dropping in level while being charged. This can avoid the problem in that the output terminal OUT cannot follow the level transition of the clock signal C1. Further, since a fall time of the output signal from the output terminal OUT (discharge time of gate line GL) is shorter than in a conventional gate-line driving circuit, a timing margin in the driving operation of the gate line GL can be increased, which achieves an improved operational reliability. Accordingly, mounting the gate-line driving circuit formed by the unit shift registers SR on the display apparatus can prevent a malfunction and achieve a normal display.

Although FIG. 3 shows the third power terminal s3 is connected to the power source VDM, the third power terminal s3 may be connected to the power source VDD similarly to the first power terminal s1. In this case, there is an advantage in reducing the number of power sources required. However, some kinds of TFTs represent $I_{DS}-V_{GS}$ characteristics as shown by dotted lines in FIG. 6. Thus, attention should be given to the case of setting the third power terminal s3 as high as VDD, which may degrade the effect of reducing the leakage current in the transistor T4.

Figure 7:
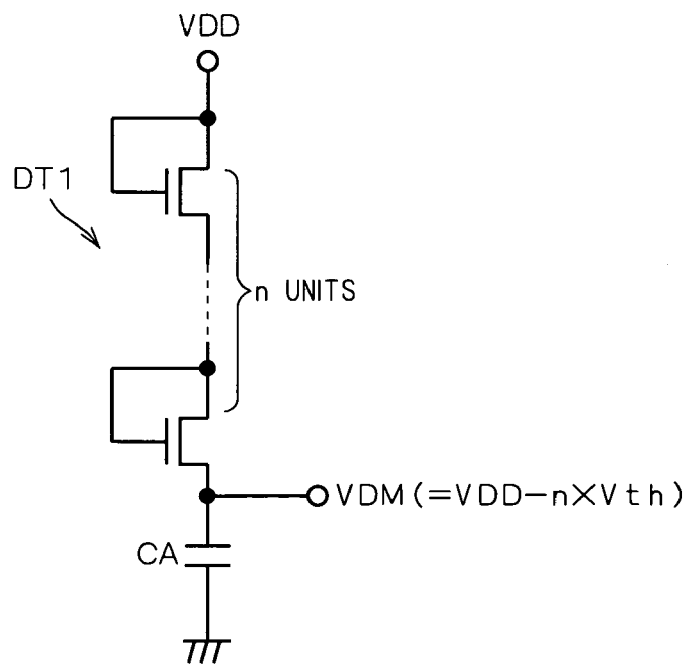
FIGS. 7 and 8 are diagrams each illustrating an example of power circuit connected to a third power terminal according to the first preferred embodiment.
Figure 8:
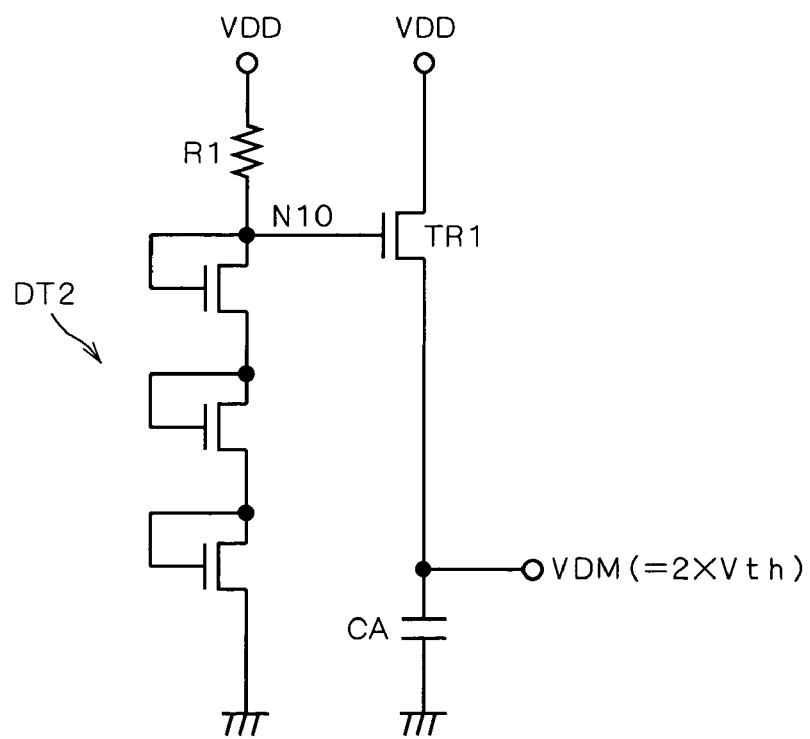

As the power source VDM connected to the third power terminal s3, a power circuit which drops the source voltage VDD and outputs the dropped voltage as the voltage VDM may be used. FIGS. 7 and 8 each illustrate an example of such power circuit.

FIG. 7 shows a power circuit for dividing the output voltage of the power source VDD by a transistor group DT1 formed by n units of diode-connected transistors connected in series and a capacitive element CA, for generating the voltage VDM. A connection node between the transistor group DT1 connected to the power source VDD and the capacitive element CA connected to the ground GND is an output terminal of voltage VDM.

Since each transistor constituting the transistor group DT1 undergoes a voltage drop by the threshold voltage Vth, the voltage VDM=VDD−n×Vth is obtained at the output terminal of VDM. The capacitive element CA serves to stabilize the level of VDM against an instantaneous load current. Since a direct current hardly flows in the power source VDM with the circuitry shown in FIG. 3, the voltage VDM can be applied from the circuit shown in FIG. 7 to all the unit shift registers SR constituting the gate-line driving circuit 30.

FIG. 8 shows another example of power circuit for dropping the output voltage of the power source VDD to generate the voltage VDM. A transistor group DT2 formed by three diode-connected transistors connected in series and a high resistive element R1 are connected in series between the power source VDD and ground GND. A connection node N10 between the high resistive element R1 and transistor group DT2 is connected to the gate of a transistor TR1. The transistor TR1 has its drain connected to the power source VDD and its source connected to the ground GND via the capacitive element CA. A connection node between the transistor TR1 and capacitive element CA is an output terminal of power source VDM.

In the circuit shown in FIG. 8, the node N10 is at approximately 3×Vth, and thus, a voltage dropped from 3×Vth by a threshold voltage of the transistor TR1 expressed as VDM=2×Vth is output to the output terminal of power source VDM. As seen from this equation, the voltage VDM does not depend upon the level transition of the power source VDD. This achieves an effect of generating the voltage VDM with more stability. This circuit is also capable of applying the voltage VDM to all the unit shift registers SR constituting the gate-line driving circuit 30, similarly to the circuit shown in FIG. 7.

Although the present embodiment has described the configuration in which the same power source VDD is connected to the first and second power terminals s1 and s2, the application of the present invention is not limited to such configuration, but different power sources may be connected to the power terminals s1 and s2. More specifically, any power source that outputs such a voltage that the transistors T2, T4 and T7 can be turned on may be connected to the second power terminal s2 instead of the power source VDD. This also applies to preferred embodiments which will be described below.

Second Preferred Embodiment

Figure 9:
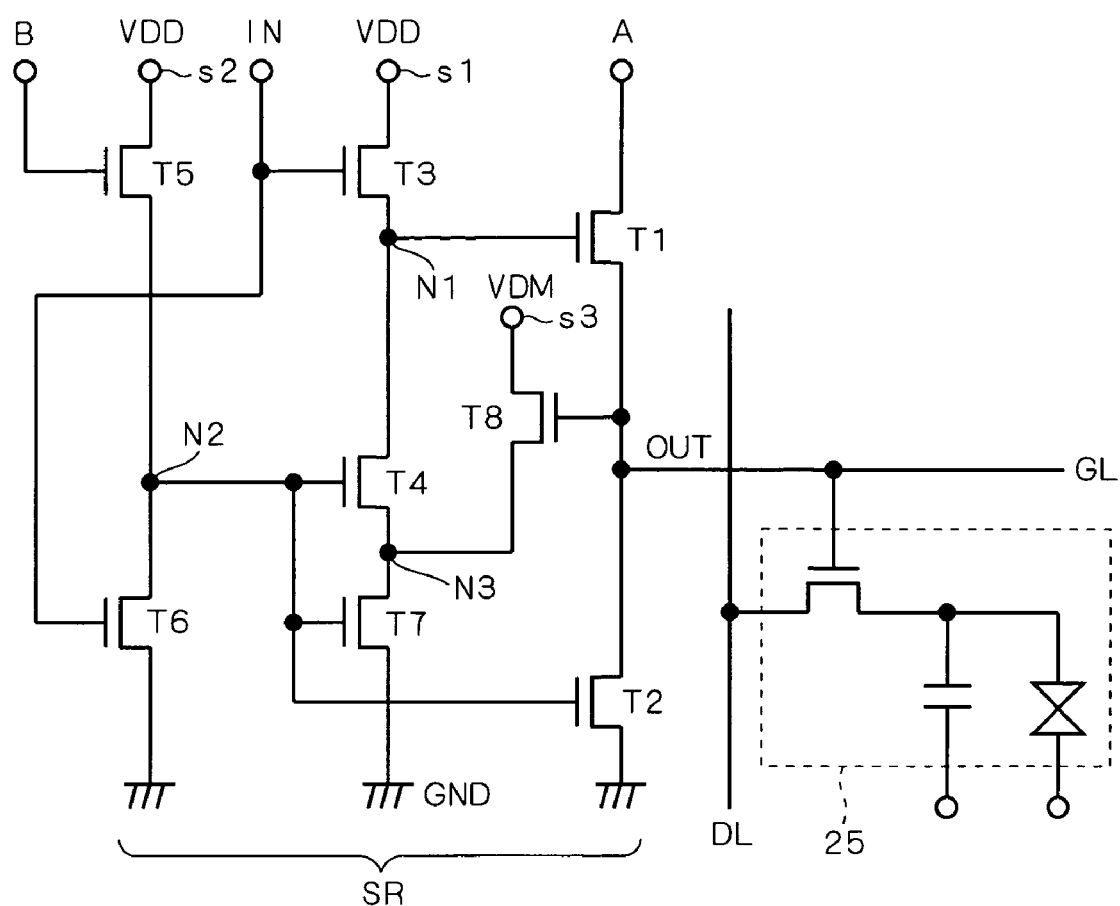
FIG. 9 is a circuit diagram illustrating the configuration of a unit shift register according to a second preferred embodiment of the invention.

FIG. 9 is a circuit diagram illustrating the configuration of a unit shift register SR according to a second preferred embodiment. In the first preferred embodiment, the transistor T8 for applying the voltage VDM to the node N3 has its gate connected to the node N1, however, the transistor T8 has its gate connected to the output terminal OUT in the present embodiment. That is, the transistor T8 is turned on when the output terminal OUT transitions to VDD.

Accordingly, in the present embodiment, the voltage VDM is applied to the node N3 via the transistor T8 only between time $t_4$ and time $t_5$ in the timing chart shown in FIG. 4. The node N3 is kept at VDM between time $t_5$ and time $t_6$ as it is in the floating state in that period. More specifically, in the present embodiment, the transistor T4 is in the negative-biased state between time $t_4$ and time $t_6$, which prevents the occurrence of leakage current at the node N1.

A period during which the occurrence of leakage current at the node N1 has to be prevented is from time $t_4$ at which the transistor T3 is turned off with the node N1 being charged to time $t_5$ at which the clock signal C1 input to the first clock terminal A rises, however, the leakage current tends to occur particularly between time $t_4$ and time $t_5$ during which the node N1 rises to 2×VDD−Vth. Accordingly, the configuration of the present embodiment in which the transistor T4 is negative biased only from time $t_4$ to time $t_5$ can achieve the effect of controlling the leakage current at the node N1 at almost the same level as in the first preferred embodiment.

Further, in the present embodiment, the number of transistors connected to the node N1 is less than in the first preferred embodiment, so that the parasitic capacitance of the node N1 is reduced. This achieves the effect of raising the node N1 in level by the clock signal input to the first clock terminal A with more efficiency.

In the present embodiment, the circuit shown in FIG. 7 or 8 may be used as means for generating the voltage of VDM.

Third Preferred Embodiment

Figure 10:
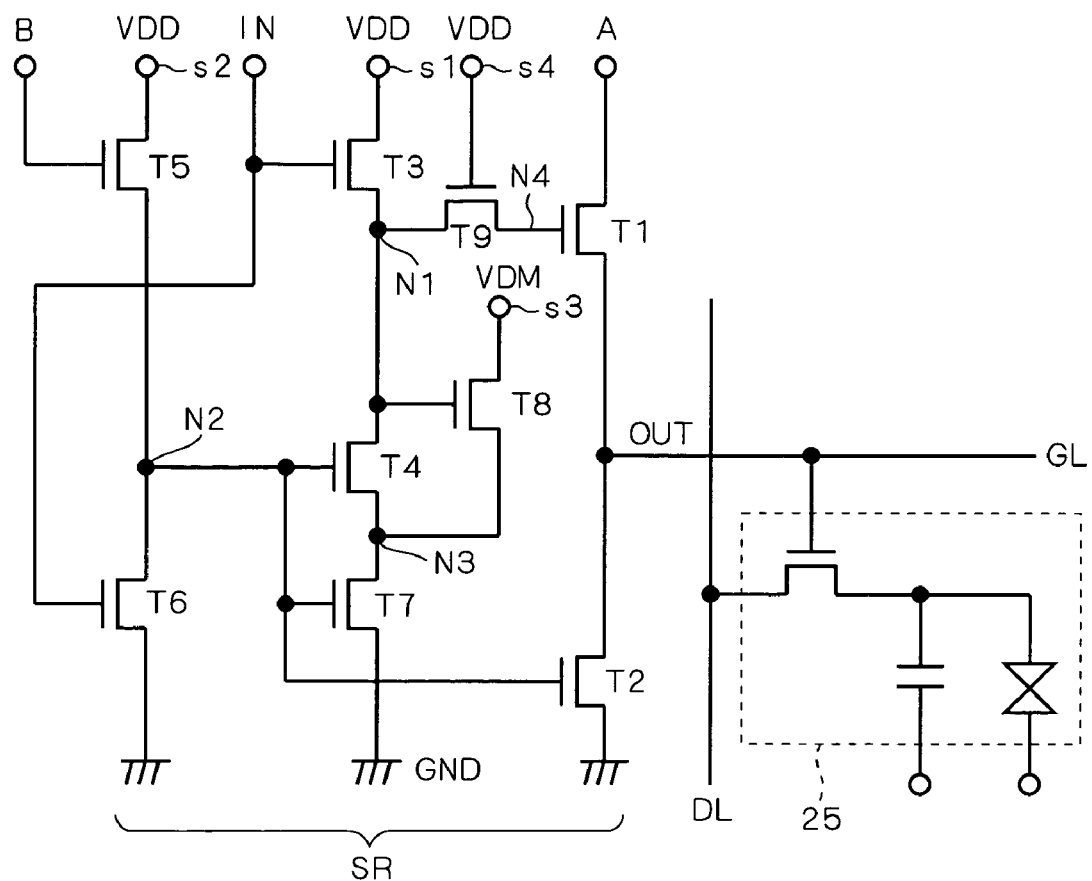
FIG. 10 is a circuit diagram illustrating the configuration of a unit shift register according to a third preferred embodiment of the invention.

FIG. 10 is a circuit diagram illustrating the configuration of a unit shift register SR according to a third preferred embodiment. In the present embodiment, the gate of the transistor T1 and the node N1 are connected via the transistor T9. The transistor T9 has its gate connected to a fourth power terminal s4. In the present embodiment, the fourth power terminal s4 is connected to the power source VDD, similarly to the first and second power terminals s1 and s2. Here, a connection node between the gate of the transistor T1 and the transistor T9 is defined as a node N4.

In the unit shift register SR according to the present embodiment, the node N4 is also charged to the VDD−Vth as well as the node N1 when an input signal is input to the input terminal IN. Then, the clock signal C1 input to the first clock terminal A transitions from 0V to VDD, and the node N4 rises to 2×VDD−Vth by capacitive coupling caused by the gate-to-channel capacitance of the transistor T1. However, the node N1 is set at a level determined by a source-follower operation of the transistor T9. In FIG. 10, the gate voltage of the transistor T9 is VDD, and thus, the node N1 does not transition from VDD−Vth.

More specifically, in the present embodiment, the node N4 rises to 2×VDD−Vth between time $t_4$ and time $t_5$ shown in the timing chart of FIG. 3, while the node N1 is kept at VDD−Vth. Therefore, the drain-to-source voltage of the transistor T4 between time $t_4$ and time $t_5$ is lower than in the first preferred embodiment, achieving the effect of further reducing the leakage current in the transistor T4 during that time period.

In the present embodiment, the gate of the transistor T9, i.e., the fourth power terminal s4 is connected to the power source VDD, similarly to the first and second power terminals s1 and s2 to avoid an increase in the number of power sources, however, the present invention is not limited to such configuration. Any other power source that can set the level at the node N1 at a value close to the level at the node N3 (VDM) by the source-follower operation of the transistor T9 may be connected to the fourth power terminal s4. In that case, effects similar to those described above can also be achieved.

Fourth Preferred Embodiment

FIG. 11 is a circuit diagram illustrating the configuration of a unit shift register SR according to a fourth preferred embodiment. The present embodiment is achieved by combining the second and third preferred embodiments. More specifically, the transistor T8 has its gate connected to the output terminal OUT, and the transistor T9 having its gate connected to the fourth power terminal s4 is connected between the gate of the transistor T1 and node N1. The fourth power terminal s4 is connected to the power source VDD in the present embodiment.

In the present embodiment, four transistors are connected to the node N1 as shown in FIG. 10, which arises a concern about an increase in parasitic capacitance at the node N1. According to the present embodiment, however, the transistor T8 is not connected to the node N1 by applying the second preferred embodiment, which can solve such problem. Further, similarly to the third preferred embodiment, the node N1 is kept at VDD−Vth even when the node N4 rises to 2×VDD−Vth, achieving the effect of reducing the drain-to-source voltage of the transistor T4 at that time, which can control the leakage current.

Fifth Preferred Embodiment

Figure 12:
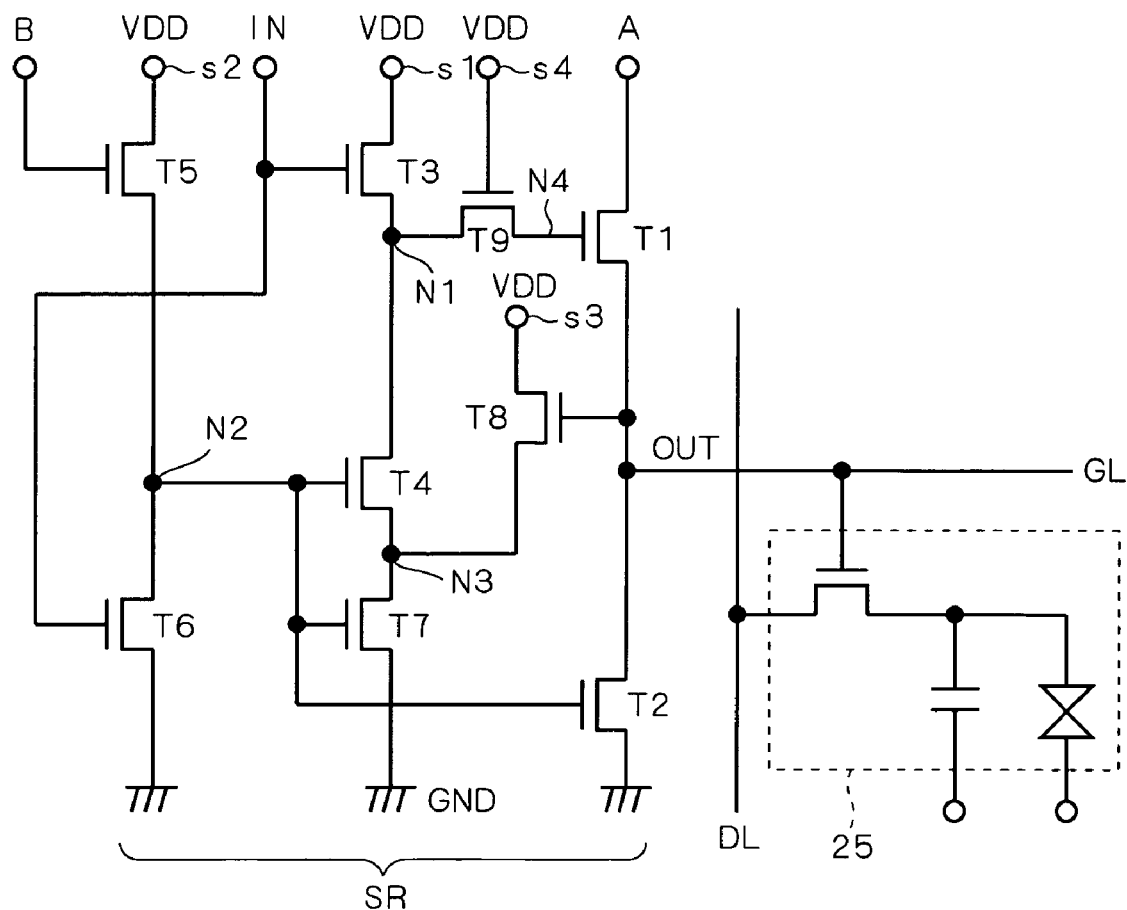
FIG. 12 is a circuit diagram illustrating the configuration of a unit shift register according to a fifth preferred embodiment of the invention.

FIG. 12 is a circuit diagram illustrating the configuration of a unit shift register SR according to a fifth preferred embodiment. The configuration of the unit shift register SR according to this embodiment is almost the same as that of the fourth preferred embodiment (FIG. 11) except that the power source VDD is connected to the third power terminal s3 to which the transistor T8 is connected, similarly to the first and fourth power terminals s1 and s4.

Since the power source VDD is connected to the fourth power terminal s4 to which the gate of the transistor T9 is connected, the node N1 is kept at VDD−Vth even when the node N4 rises to 2×VDD−Vth, similarly to the fourth preferred embodiment. Further, since the power source VDD is connected to the third power terminal s3, the node N3 transitions to VDD−Vth at that time. That is, the drain-to-source voltage of the transistor T4 transitions to approximately 0V, causing no leakage current to flow between the drain and source of the transistor T4. This in turn achieves the effect of preventing the gate voltage of the transistor T1 from dropping in level.

In the present embodiment, the power source VDD is connected to both the third and fourth power terminals s3 and s4 to avoid an increase in the number of power sources, however, any other power source that can set the level at the node N1 at a value almost the same as that of the node N3 may be used.

Sixth Preferred Embodiment

Figure 13:
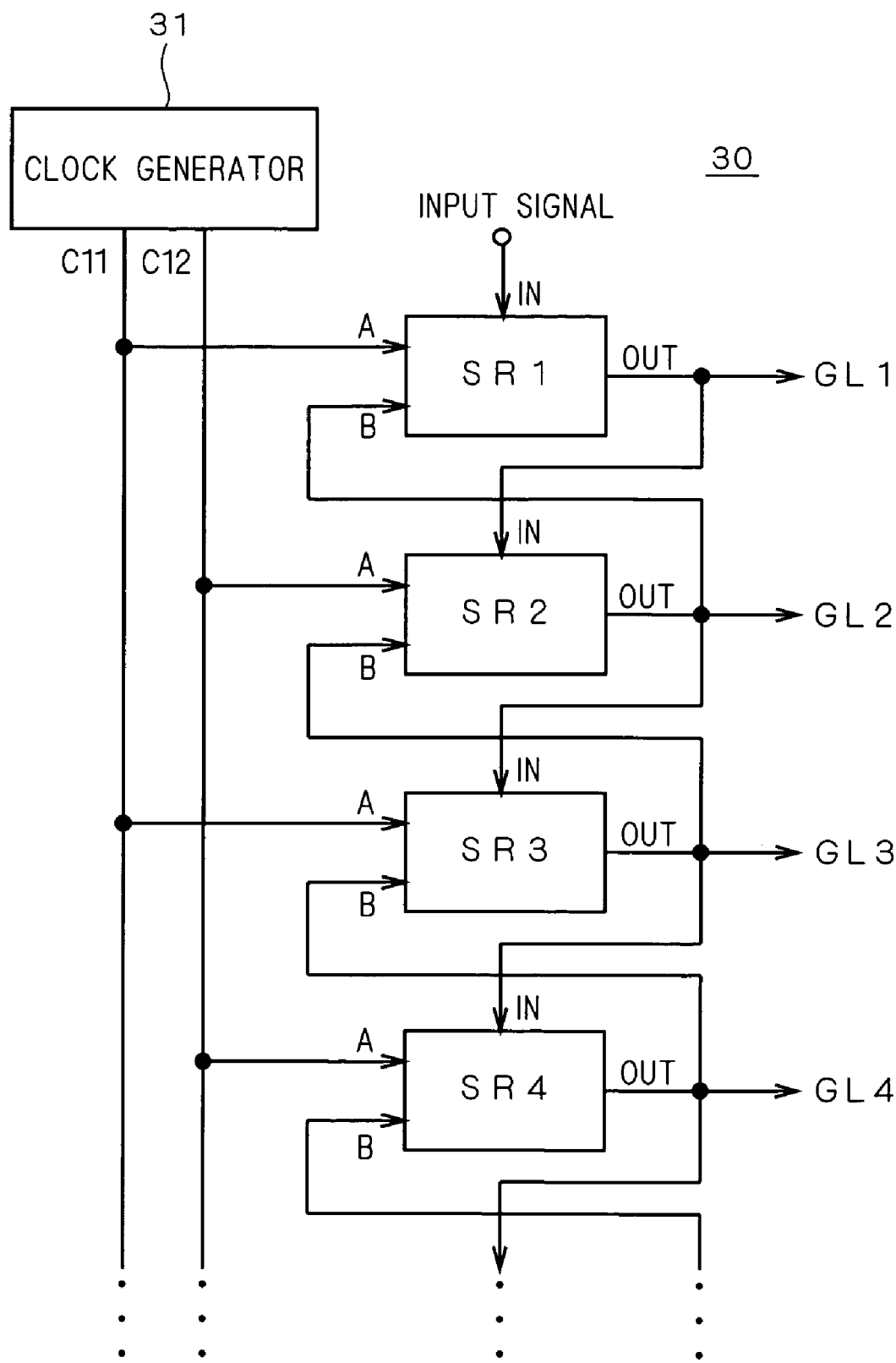
FIG. 13 is a block diagram illustrating the configuration of a gate-line driving circuit of a display apparatus according to a sixth preferred embodiment of the invention.

The above description has shown the configuration in which the unit shift register SR of the gate-line driving circuit 30 is operated using three phase clock signals C1, C2 and C3 as shown in FIG. 2, however, two phase clock signals may be used instead. FIG. 13 shows the configuration of the gate-line driving circuit 30 in that case.

In this case, the gate-line driving circuit 30 is also formed by a plurality of unit shift registers SR connected in cascade. The clock generator 31 outputs two phase clock signals C11 and C12 of opposite phase to each other. Either the clock signal C11 or C12 is input to the first clock terminal A of each unit shift register SR such that the clock signals of opposite phase to each other are input alternately to adjacent unit shift registers SR. The second clock terminal B of each unit shift register SR receives an output signal output from a unit shift register SR of the immediately succeeding stage.

Figure 14:
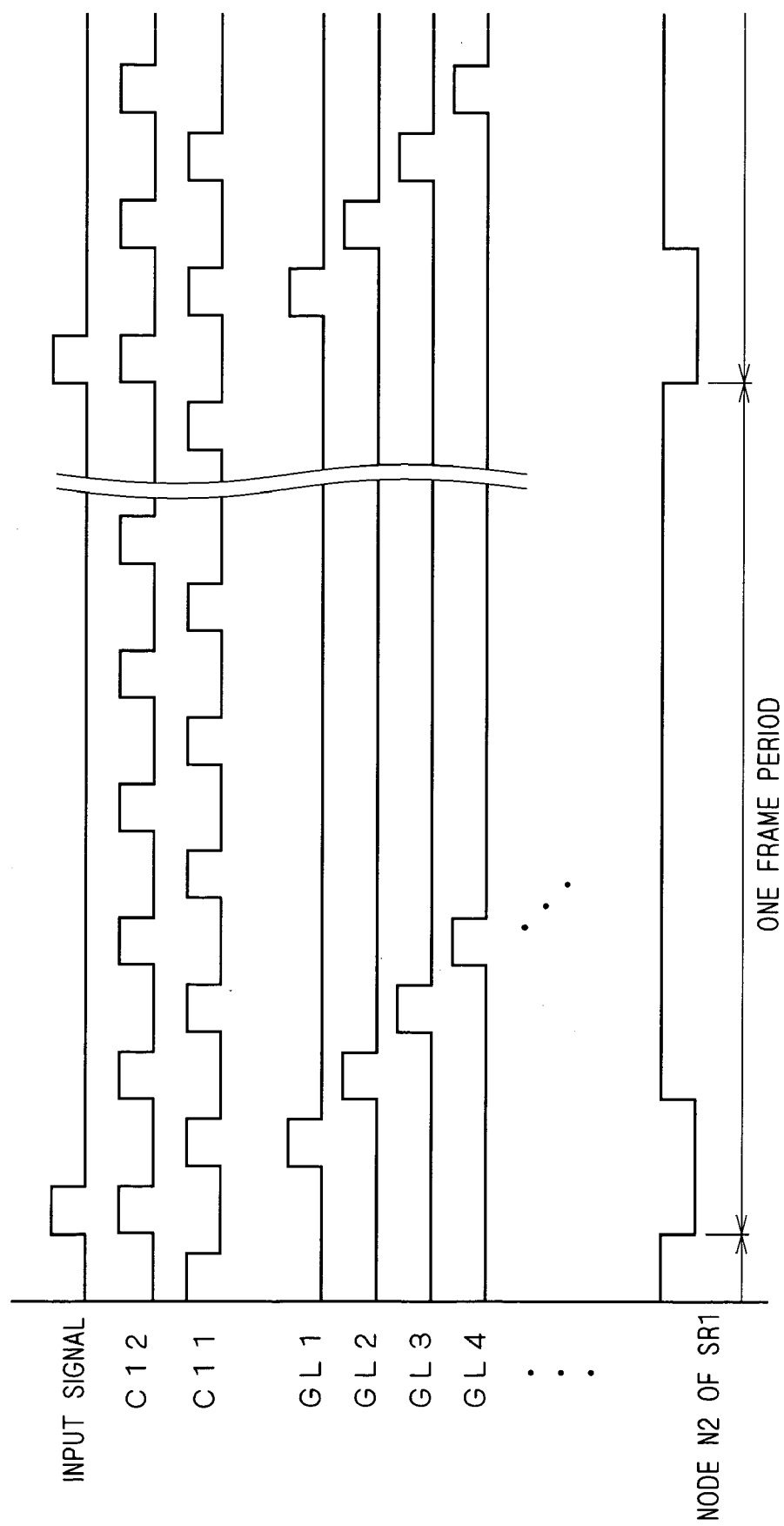
FIG. 14 is a timing chart showing an operation of the gate-line driving circuit of the display apparatus according to the sixth preferred embodiment.

FIG. 14 is a timing chart when the gate-line driving circuit 30 is operated using the two phase clock signals C11 and C12. An input signal input to the input terminal IN of the unit shift register SR of first stage is transmitted sequentially to the unit shift registers SR2, SR3, . . . while being shifted in synchronization with the clock signals C11 and C12. Accordingly, the gate-line driving circuit 30 is capable of driving the gate lines GL1, GL2, GL3, . . . sequentially in a predetermined scanning cycle.

With the circuitry shown in FIG. 13, however, the clock signal input to the second clock terminal B of each unit shift register SR is an output signal from a unit shift register SR of the immediately succeeding stage. Thus, the reset node (node N2 shown in FIG. 3) is not reset to VDD−Vth until the unit shift register SR of the immediately succeeding stage is operated at least once, so that a normal operation as shown in FIG. 14 cannot be achieved. Therefore, prior to the normal operation, a dummy operation needs to be performed for transmitting a dummy input signal from the unit shift register SR of first stage to the unit shift register SR of last stage. Alternatively, a transistor for reset may be provided between the reset node and power source VDD to perform a reset operation for previously charging the reset node prior to the normal operation. In that case, however, a signal line for the reset needs to be provided additionally.

The problem of leakage current in the unit shift registers SR constituting the gate-line driving circuit 30 configured as shown in FIG. 13 will now be described. For ease of description, each of the unit shift registers SR shown in FIG. 13 is assumed to have the circuitry described in the first preferred embodiment (FIG. 3).

The voltage waveform at the node N2 of the unit shift register SR1 of the gate-line driving circuit 30 shown in FIG. 13 is shown in the lowermost position in FIG. 14. As described above, the clock signal input to the second clock terminal B of each unit shift register SR is an output signal from the immediately succeeding stage. Thus, the node N2 shall be charged only once in one frame period. That is, the node N2 is in the floating state for as long as one frame period (about 16 ms), arising the need to store electric charge accumulated in that period. Thus, when the leakage current occurs at the node N2, the level at the node N2 having been charged cannot be held for as long as one frame period. In this case, the impedance of the transistor T2, that is, the output impedance of the gate-line driving circuit 30 in the non-selective state of the gate line GL increases, causing a problem of unstable display.

Accordingly, this sixth preferred embodiment will propose a unit shift register SR capable of controlling the leakage current occurring at the node N2.

Figure 15:
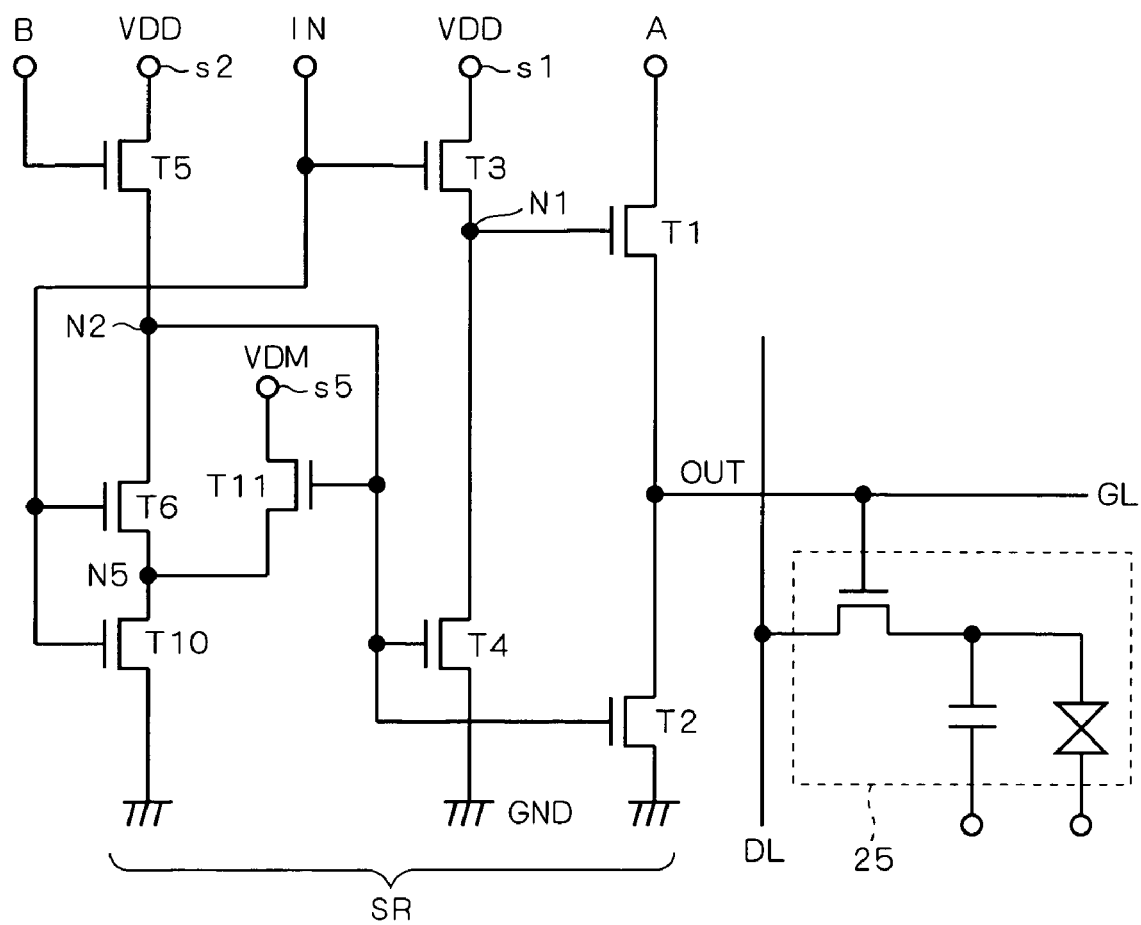
FIG. 15 is a circuit diagram illustrating the configuration of a unit shift register according to the sixth preferred embodiment.

FIG. 15 is a circuit diagram illustrating the configuration of the unit shift register SR according to the present embodiment. In the present embodiment, the transistor T6 and ground GND (reference voltage terminal) are connected via the transistor T10. In other words, the transistors T6 and T10 are connected in series between the node N2 and ground GND. The transistor T10 has its gate connected to the input terminal IN, similarly to the gate of the transistor T6. A connection node between the transistors T6 and T10 is defined as a node N5.

Further, in the present embodiment, a transistor T11 is connected between the node N5 and a fifth power terminal s5. The power source VDM is connected to the fifth power terminal s5, and the transistor T11 has its gate connected to the node N2.

As will be apparent from the above-mentioned U.S. Pat. No. 5,222,082 and JP2002-313093, the conventional unit shift register has only one transistor connected between the node N2 and reference voltage terminal (ground GND) (e.g., transistor 21 shown in FIG. 2 of U.S. Pat. No. 5,222,082). In other words, the conventional unit shift register is configured such that the transistor T6 has its source directly connected to the ground GND removing the transistors T10 and T11 from the circuit shown in FIG. 15.

In the present embodiment, as shown in FIG. 15, the two transistors T6 and T10 are connected in series between the node N2 and ground GND, and the transistor T11 connected to the power source VDM is connected to the node N5 between the transistors T6 and T10. Since the gates of the transistors T6 and T10 are connected in common to the input terminal IN, the transistors T6 and T10 are switched on/off with the same timing. Since the gate of the transistor T11 is connected to the node N2, the transistor T11 is turned on when the node N2 is at a high level (that is, when the transistors T6 and T10 are off).

Accordingly, when a clock signal (output signal from the immediately succeeding stage) is input to the second clock terminal B of the unit shift register SR, to cause the node N2 to transition to VDD−Vth, the transistor T11 is turned on, and the source voltage VDM is applied to the node N5. Since the transistors T6 and T10 are held off until an input signal is input to the input terminal IN, the node N5 transitions to VDM. Focusing attention on the transistor T6 at this time, the gate (input terminal IN) is at 0V, the drain (node N2) is at VDD−Vth, and the source (node N5) is at VDM (>0V). That is, the gate of the transistor T6 is negative biased. This state continues until the node N2 is reset to 0V in response to the input signal input to the input terminal IN.

As described, with the unit shift register SR according to the present embodiment, the transistor T6 is in the negative-biased state while the node N2 is charged. In this period, a leakage current in the transistor T6 is controlled based on the same theory described with respect to the transistor T4 in the first preferred embodiment (FIG. 6). This allows the level at the node N2 having been charged to be held for a long time. Therefore, the present embodiment is effective in the case where the level at the reset node (node N2) of the unit shift register SR needs to be held for as long as one frame period, similarly to the gate-line driving circuit 30 shown in FIG. 13. That is, the problem of an increased output impedance of the gate-line driving circuit 30 in the non-selective state of the gate line GL causes unstable display can be solved.

In the present embodiment, the circuit shown in FIG. 7 or 8 may be used as means for generating the voltage VDM.

Further, the power source VDD may be connected to the fifth power terminal s5, similarly to the second power terminal s2. In that case, the node N5 is also charged to VDD−Vth while the node N2 is charged to VDD−Vth. More specifically, the drain-to-source voltage of the transistor T6 transitions to approximately 0V at that time, causing no leakage current to flow in the transistor T6. This achieves the effect of preventing the node N2, i.e., the gate of the transistor T2 from dropping in level. There is also an advantage in that the number of power sources required can be reduced by changing the power source VDM to power source VDD.

The above description has been based on the gate-line driving circuit 30 shown in FIG. 13, however, the circuitry shown in FIG. 2 can also perform a normal operation and control the leakage current at the node N2. This also applies to unit shift registers SR according to preferred embodiments which will be described below. With the circuitry shown in FIG. 2, however, one of the clock signals C1 to C3 is input to the second clock terminal B, so that the node N2 is charged in that cycle, and does not remain in the floating state for as long as one frame period. Therefore, the problem of the leakage current at the node N2 is less serious than in the circuit shown in FIG. 13.

Seventh Preferred Embodiment

FIG. 16 is a circuit diagram illustrating the configuration of a unit shift register SR according to a seventh preferred embodiment. In the sixth preferred embodiment (FIG. 15), the transistor T11 has its gate connected to the node N2, however, the gate is connected to the first clock terminal A in the present embodiment. That is, the transistor T11 is turned on when the first clock terminal A transitions to VDD.

With the circuitry shown in FIG. 15, when a little leakage current occurs in the transistor T6, causing the node N2 to drop in level, the impedance of the transistor T11 increases correspondingly, causing the node N5 to also drop in level. This arises a concern that the effects of the present invention may be degraded so that a leakage current in the transistor T6 increases.

In contrast, with the circuitry shown in FIG. 16, a clock signal (either the clock signal C11 or C12 shown in FIG. 13) having a cycle shorter than one frame period is input to the gate of the transistor T11. Since the node N5 is charged in the cycle of this clock signal with reliability, the node N5 is kept at VDM, which can prevent the effects of the present invention from being reduced.

The first clock terminal A of each unit shift register SR receives a clock signal of opposite phase to one input to an adjacent unit shift register SR, and the input terminal IN receives an output signal of a unit shift register SR of the immediately preceding stage (i.e., adjacent unit shift register SR). Accordingly, the input terminal IN and the gate of the transistor T11 (first clock terminal A) are not activated at the same time. Therefore, the transistors T10 and T11 are not turned on at the same time, and a short circuit current is prevented flowing from the power source VDM to ground GND via the transistors T10 and T11.

Further, in the present embodiment, the power source VDD may be connected to the fifth power terminal s5, similarly to the second power terminal s2. In that case, the node N5 is also charged to VDD−Vth while the node N2 is charged to VDD−Vth. The drain-to-source voltage of the transistor T6 transitions to approximately 0V, so that no leakage current flows in the transistor T6. There is also an advantage in reducing the number of power sources required by changing the power source VDM to power source VDD.

Eighth Preferred Embodiment

The sixth and seventh preferred embodiments have proposed the configuration for controlling the leakage current in the transistor T6 to solve the problem of the leakage current at the node N2 of the unit shift register SR. In contrast, to solve the problem, the present embodiment will propose a unit shift register SR capable of compensating for the level transition at the node N2 caused by a leakage current.

FIG. 17 is a circuit diagram illustrating the configuration of a unit shift register SR according to an eighth preferred embodiment. As shown in the drawing, the unit shift register SR includes a compensation circuit formed by a transistor T13 connected between a sixth power terminal s6 and node N2, a transistor T12 connected between the gate of the transistor T13 (defined as a node N6) and node N2 and a capacitive element CB connected between the node N6 and first clock terminal A. The transistor T12 has its gate connected to a seventh power terminal s7. In the present embodiment, the first, second, sixth and seventh power terminals s1, s2, s6 and s7 are all connected to the power source VDD.

This compensation circuit is a circuit for applying the voltage at the sixth power terminal s6 (power source VDD) to the node N2 for charging the node N2. More specifically, the compensation circuit applies a current larger than a leakage current in the transistor T6 from the sixth power terminal s6 (power source VDD) to the node N2 via the transistor T13, thereby compensating for the level at the node N2 dropped by the leakage current.

In the normal operation, the node N2 is charged to VDD–Vth when a clock signal (output signal from the immediately succeeding stage) is input to the second clock terminal B. Since the transistor T12 is held on at this time, the node N6 is also charged to VDD–Vth. When the clock signal (C11 or C12) at the first clock terminal A transitions from 0V to VDD after the second clock terminal B transitions to 0V, the node N6 rises approximately to 2×VDD–Vth because of capacitive coupling caused by the capacitive element CB.

Since the transistor T12 has its drain connected to the node N6 and its source connected to the node N2, the gate-to-source voltage of the transistor T12 is approximately Vth (threshold voltage). Thus, the transistor T12 has a high impedance almost in the off state, so that a current hardly flows in the transistor T12. Accordingly, the node N6 is kept at 2×VDD–Vth while the first clock terminal A is at VDD. Since the transistor T13 is turned on in this period, the node N2 rises to VDD.

With the circuitry shown in FIG. 13, the second clock terminal B is at 0V for about one frame period, and clock signals are repeatedly input to the first clock terminal A in that period. Since the transistor T13 is accordingly turned on repeatedly while the second clock terminal B is at 0V to charge the node N2, the level at the node N2 is compensated for and is kept at approximately VDD even when a leakage current occurs at the node N2. In other words, the output terminal OUT can be kept at a low impedance of 0V.

When the input terminal IN transitions to VDD upon receipt of an input signal, the transistor T6 is turned on to cause the node N2 to transition to 0V. Then, the gate-to-source voltage of the transistor T12 transitions to VDD, so that the transistor T12 is turned on, and the node N6 transitions to a low impedance of 0V. Thus, during a period in which the node N2 is set at 0V, the node N6 hardly rises in level even when the first clock terminal A transitions to VDD, and the transistor T13 is held off and flows no current. More specifically, the node N2 does not unnecessarily rise in level when the gate line GL is selected, which prevents the transistor T2 from being turned on. In addition, a short circuit current is prevented from flowing from the power source VDD to the ground GND via the transistors T13 and T6.

As described, the unit shift register SR according to the present embodiment includes the compensation circuit for applying, to the node N2, a voltage (VDD in this embodiment) that holds the transistor T2 on during a period in which the node N2 is charged to turn on the transistor T2, thereby charging the node N2. Thus, even when a leakage current occurs in the transistor T6, the level transition at the node N2 is compensated for. Accordingly, the impedance of the transistor T2 is prevented from rising in the non-selective state of the gate line GL. Therefore, mounting the gate-line driving circuit formed by the unit shift register SR on the display apparatus can prevent a malfunction and achieve a normal display.

In FIG. 17, the gate of the transistor T12, that is, the seventh power terminal s7 is connected to the power source VDD. In this case, the gate-to-source voltage of the transistor T12 just after the nodes N2 and N6 are charged transitions to Vth, bringing the transistor T12 almost into the off state. To completely turn off the transistor T12 at this time, the seventh power terminal s7 may be made lower than VDD, e.g., VDD–Vth or 2×VDD–Vth.

For instance, setting the seventh power terminal s7 at VDD–Vth, the source (node N2) is at VDD–Vth when the node N6 rises in level. Accordingly, the gate-to-source voltage of the transistor T12 transitions to 0V, so that the transistor T12 is completely turned off.

Alternatively, setting the seventh power terminal s7 at VDD–2×Vth, for example, the gate-to-source voltage of the transistor T12 transitions to –Vth when the node N6 rises in level, causing the gate to be reverse biased with respect to the source, so that the transistor T12 is completely turned off. In this case, the node N6 is at VDD–3×Vth before being raised in level in response to the clock signal input to the first clock terminal A, and transitions to 2×VDD–3×Vth when being raised in level. In other words, the gate-to-source voltage of the transistor T13 is expressed as: (2×VDD–3× Vth)–(VDD–Vth)=VDD–2×Vth. Usually, VDD>>2×Vth holds, the voltage is at a level sufficient to turn on the transistor T13.

Figure 18:
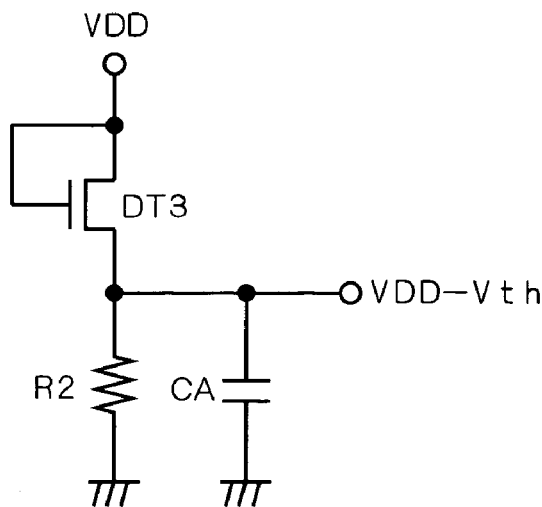
FIGS. 18 and 19 are diagrams each illustrating an example of power circuit connected to a seventh power terminal according to the eighth preferred embodiment.
Figure 19:
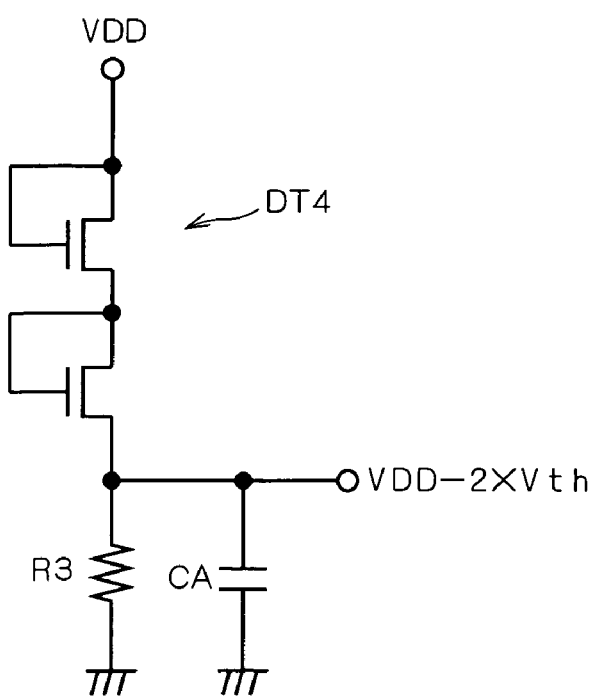

FIGS. 18 and 19 are diagrams each illustrating an example of power circuit connected to the seventh power terminal s7. FIG. 18 shows a power circuit for generating the voltage of VDD–Vth, in which the output of the power source VDD is output upon being divided by a diode-connected transistor DT3 and a high resistive element R2. The capacitive element CA is provided for stabilizing the output voltage in level. Since a voltage drop by the threshold voltage Vth occurs in the transistor DT3, the output voltage of VDD–Vth is obtained from this power circuit.

FIG. 19 shows a power circuit for generating the voltage of VDD–2×Vth, in which the output of the power source VDD is output upon being divided by a transistor group DT4 formed by two diode-connected transistors and a high resistive element R3. Since each of the two transistors constituting the transistor group DT4 undergoes a voltage drop by the threshold voltage Vth, the output voltage of VDD–2× Vth is obtained from this power circuit. In FIG. 19, the capacitive element CA is also provided for stabilizing the output voltage in level.

Further, combining the sixth and seventh preferred embodiments with the present embodiment can prevent a leakage current from occurring in the transistor T6, and a leakage current, if occurred in the transistor T6, is compensated for. Accordingly, higher effects of solving the problem of leakage current in the transistor T6 can be obtained.

Ninth Preferred Embodiment

Figure 20:
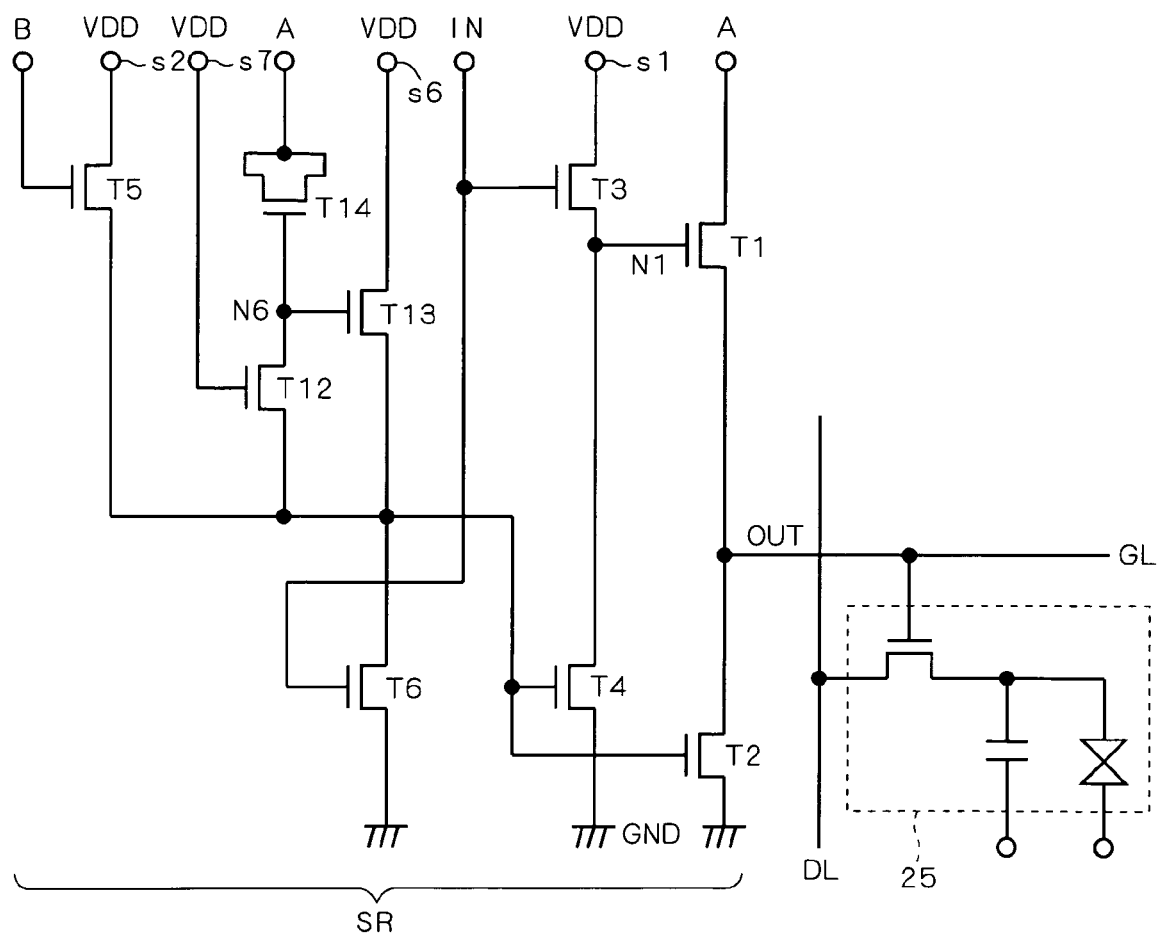
FIG. 20 is a circuit diagram illustrating the configuration of a unit shift register according to a ninth preferred embodiment of the invention.

FIG. 20 is a circuit diagram illustrating the configuration of a unit shift register SR according to a ninth preferred embodiment. According to the present embodiment, as shown in the drawing, the capacitive element CB shown in FIG. 17 of the eighth preferred embodiment is replaced by a capacitive element formed by a drain-source connected transistor T14. Such a capacitive element configured using a MOS transistor is called a "MOS capacitive element" or "channel capacitive element".

In the case of replacing the capacitive element CB shown in FIG. 17 by the MOS capacitive element formed by the transistor T14, the transistor T14 is off when the node N6 is at 0V, so that a channel is not formed between its source and drain, which is equivalent to that no capacitance is connected between the node N6 and first clock terminal A. Thus, the node N6 is kept at 0V with reliability even when the first clock terminal A transitions from 0V to VDD when the nodes N2 and N6 are at 0V. That is, the transistor T13 can be turned off with reliability when the gate line GL is selected, which prevents an unnecessary level rise at the node N2. In other words, the transistor T2 is prevented from turning on with more reliability when the gate line GL is selected.

Tenth Preferred Embodiment

Figure 21:
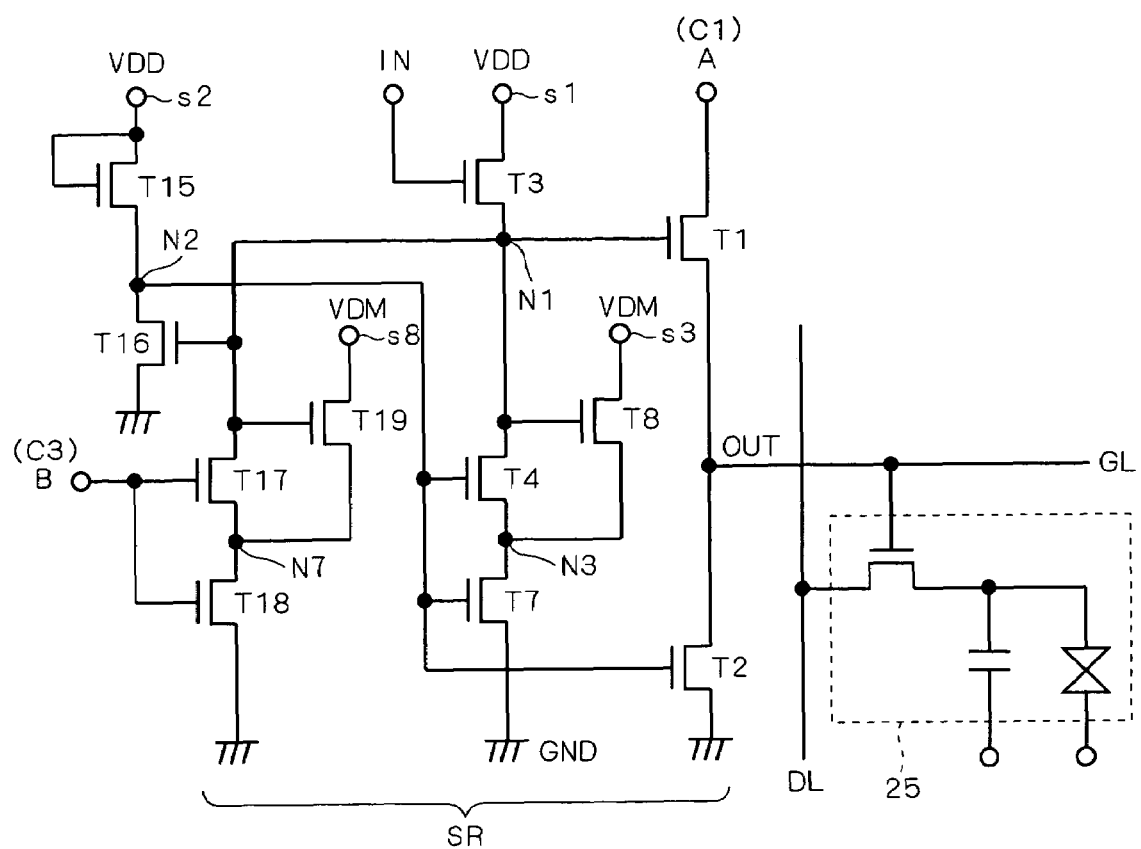
FIG. 21 is a circuit diagram illustrating the configuration of a unit shift register according to a tenth preferred embodiment of the invention.

FIG. 21 is a circuit diagram illustrating the configuration of a unit shift register SR according to a tenth preferred embodiment. The unit shift register SR replaces the transistors T5 and T6 of the circuit shown in FIG. 3 by transistors T15 to T19. That is, a driving section of the unit shift register SR according to the present embodiment is formed by the transistors T3, T4, T7, T8 and T15 to T19.

The transistors T15 and T16 are connected in series between the second power terminal s2 (power source VDD) and reference voltage terminal (ground GND), and a connection node between these transistors T15 and T16 is the node N2. The transistor T15 is diode connected, and serves as a load. The transistor T16 has its gate connected to the node N1.

The transistors T17 and T18 are connected in series between the node N1 and reference voltage terminal (ground GND), and have their gates connected in common to the second clock terminal B (or any other terminal that synchronizes with a clock signal input to the second clock terminal B). A connection node between these transistors T17 and T18 is defined as a node N7. The transistor T19 is connected between the node N7 and an eighth power terminal s8, and has its gate connected to the node N1. In the present embodiment, the eighth power terminal s8 is connected to the power source VDM.

The driving section of the unit shift register SR according to the present embodiment has a different circuitry from those of the above-described preferred embodiments, but operates almost in the same way. More specifically, the driving section according to the present embodiment also applies the voltage of the reference voltage terminal (ground GND) to the node N1 and the voltage of the second power terminal s2 (power source VDD) to the node N2 in synchronization with a clock signal input to the second clock terminal B, while applying the voltage of the first power terminal s1 (power source VDD) to the node N1 and the voltage of the reference voltage terminal (ground GND) to the node N2 in response to an input signal input to the input terminal IN. The operation will be described below.

Figure 22:
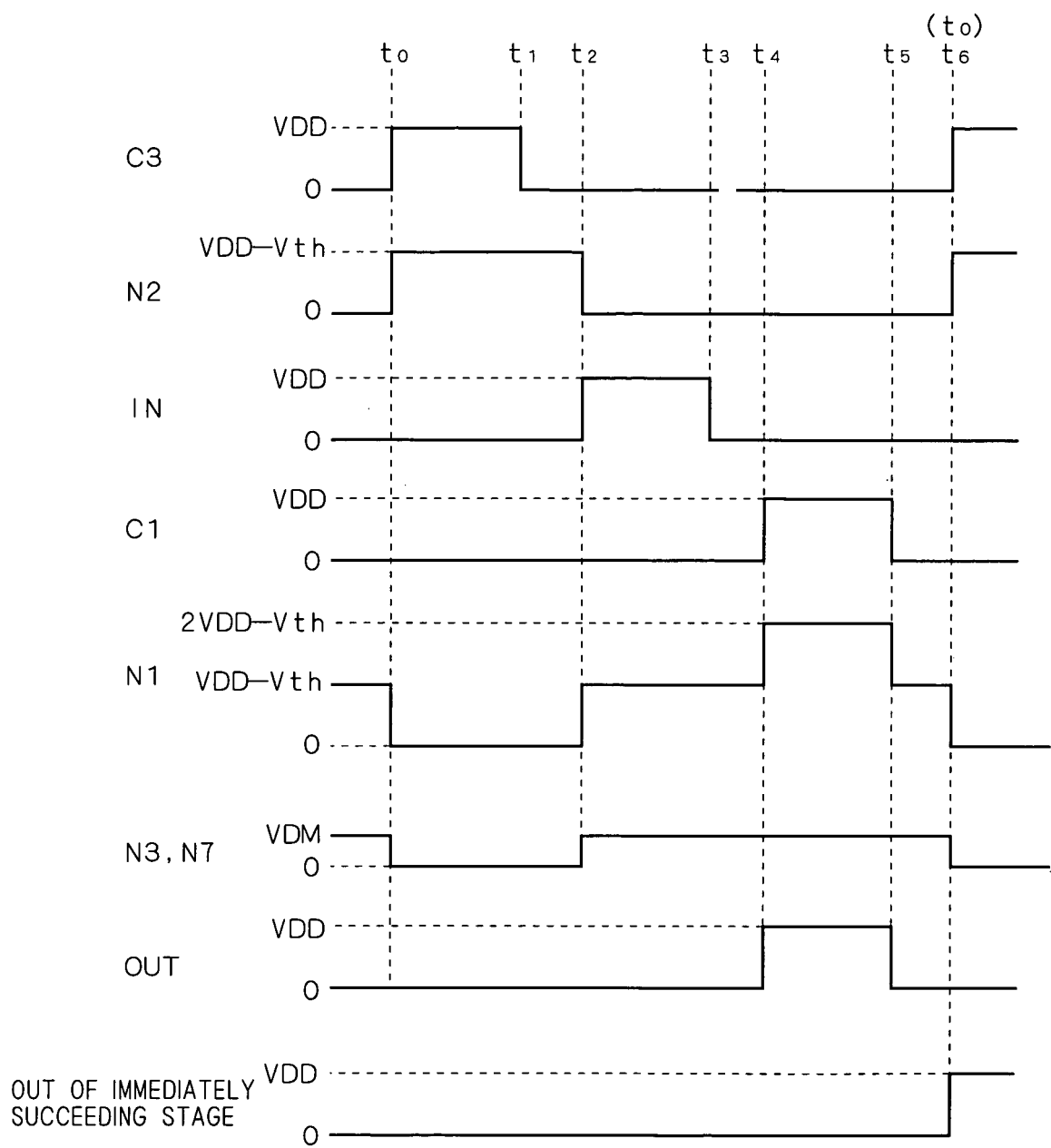
FIG. 22 is a timing chart showing an operation of the unit shift register according to the tenth preferred embodiment.

FIG. 22 is a timing chart showing an operation of the unit shift register SR according to the tenth preferred embodiment. Similarly to the description with reference to FIG. 4, the following description will be made assuming that the clock signal C1 is input to the first clock terminal A of the unit shift register SR and the clock signal C3 is input to the second clock terminal B.

As shown in FIG. 22, when the clock signal C3 (at the second clock terminal B) transitions from 0V to VDD at time $t_0$, the transistors T17 and T18 are turned on, causing the node N1 to drop in level. Then, the transistor T16 is turned off causing the node N2 to transition to VDD–Vth. The transistors T4 and T7 are accordingly turned on, causing the node N1 to transition to 0V. At this time, the nodes N3 and N7 both transition to 0V along with the node N1. As a result, the transistor T1 is turned off, and the transistor T2 is turned on, so that the output terminal OUT transitions to 0V, bringing the gate line GL into an inactive state (non-selective state) having a low impedance.

Next, when the clock signal C3 returns to 0V at time $t_1$, the transistors T17 and T18 are turned off, while the transistors T4 and T6 are held on and the transistor T16 is held off. Thus, the node N1 is kept at 0V, and the node N2 is kept at VDD–Vth.

At time $t_2$, a signal is input to the input terminal IN, causing the input terminal IN to transition to VDD. Then, the transistor T3 is turned on, causing the node N1 to rise in level. Then, the transistor T16 is turned on, causing the node N2 to transition to 0V, so that the transistors T2, T4 and T7 are turned off. Accordingly, the node N1 transitions to VDD–Vth.

In the present embodiment, the transistors T8 and T19 are turned on at this time, causing the voltage of the power source VDM to be applied to each of the nodes N3 and N7, so that the level at the nodes N3 and N7 transition to VDM. In other words, the transistors T4 and T7 are both brought into the reverse biased state.

When the input terminal IN returns to 0V at time $t_3$, the transistor T3 is turned off, however, the node N1 is brought into the floating state since the transistors T4, T7, T17 and T18 are also off. At this time, a leakage current hardly occurs at the node N1 since the transistors T4 and T7 are both reverse biased. Accordingly, the node N1 is kept at VDD–Vth with reliability.

Next, when the clock signal C1 input to the first clock terminal A transitions from 0V to VDD at time $t_4$, capacitive coupling caused by the gate-to-channel capacitance of the transistor T1 allows the gate of the transistor T1 to rise in level following the rising of the clock signal C1, causing the node N1 to transition to 2×VDD–Vth. The output terminal OUT transitions to VDD following the rising of the clock signal C1, so that the gate line GL is activated.

At time $t_5$, the clock signal C1 transitions to 0V. Since a leakage current hardly occurs at the node N1, the node N1 is kept at 2×VDD–Vth until this point of time, and the output terminal OUT drops to 0V following the falling of the clock signal C1.

At time $t_6$ and thereafter, the above-described operation is repeated. The gate-line driving circuit 30 operates such that gate lines GL are sequentially activated one by one in a cycle of one frame period. Therefore, an input signal is input to each unit shift register SR only once in one frame period. The clock signals C1 and C3 are also input to the first and second clock terminals A and B, respectively, during a period in which no signal is input (i.e., in the non-selective state of the gate line GL). In this period, the transistors T4 and T7 are held on, and the transistor T16 is held off, so that the node N1 is kept at 0V, and the node N2 is kept at VDD–Vth. Therefore, in the non-selective state of the gate line GL, the transistor T1 is held off, and the transistor T2 is held on.

For instance, the unit shift registers SR described in the first to fifth preferred embodiments cause a problem in that the node N2 cannot be kept at VDD–Vth when a leakage current occurs at the node N2 since the node N2 is brought into the floating state when the second clock terminal B transitions to 0V during the period in which no signal is input. As described earlier, particularly when connecting a plurality of unit shift registers SR as shown in FIG. 13, the period during which the node N2 is in the floating state is one frame period, making the problem more serious. Accordingly, in the present invention, the sixth to ninth preferred embodiments each have proposed the unit shift register SR that can solve the problem.

In contrast, in the unit shift register SR according to the present embodiment, once the node N1 is set at 0V and the node N2 at VDD–Vth, the transistors T4 and T7 are held on and the transistor T16 is held off until the input terminal IN next transitions to VDD. Thus, the node N2 is kept at VDD–Vth without being brought into the floating state. In other words, the transistors T3, T4, T7, T5 and T16 serve as a flip-flop circuit, and the node N1 is latched at 0V and the node N2 is latched at VDD–Vth. Therefore, the present embodiment brings an advantage in that the above-mentioned problem resulting from the leakage current at the node N2 does not arise. However, power consumption is higher than in the first to ninth preferred embodiments since a short circuit current flows from the power source VDD to ground GND via the transistors T15 and T16 during a period in which an input signal is input to the input terminal IN and the node N2 is set at 0V (from time $t_2$ to time $t_6$ shown in FIG. 22).

As described above, the driving section of the unit shift register SR according to the present embodiment is configured such that the transistors T8 and T19 are turned on and the voltage of the power source VDD is applied to both the nodes N3 and N7 during a period in which the node N1 transitions to VDD–Vth (i.e., a period in which the transistors T4, T7, T17 and T18 are held off: in the present embodiment, from time $t_2$ to time $t_6$ shown in FIG. 22). That is, the transistors T4 and T17 interposed between the node N1 and ground GND are reverse biased in that period, allowing the leakage current at the node N1 to be reduced.

Therefore, according to the present embodiment, the node N1 is prevented from dropping in level while being charged. This can avoid the problem in that the output terminal OUT cannot follow the level transition of the clock signal C1, similarly to the first preferred embodiment. Further, the fall time (discharge time of the gate line GL) of the output signal from the output terminal OUT is shorter than in the conventional gate-line driving circuit, which produces an effect of providing a greater timing margin in the driving operation of the gate line GL.

Although FIG. 21 shows that the power source VDM is connected to the third and eighth power terminals s3 and s8, the power source VDD may be connected instead, similarly to the first power terminal s1. In this case, there is an advantage in reducing the number of power sources required. However, some kinds of TFTs represent $I_{DS}$-$V_{GS}$ characteristics as shown by dotted lines in FIG. 6. Thus, attention should be given to the case of setting the third and eighth power terminals s3 and s8 as high as VDD, which may degrade the effect of reducing leakage currents in the transistors T4 and T17.

Figure 23:
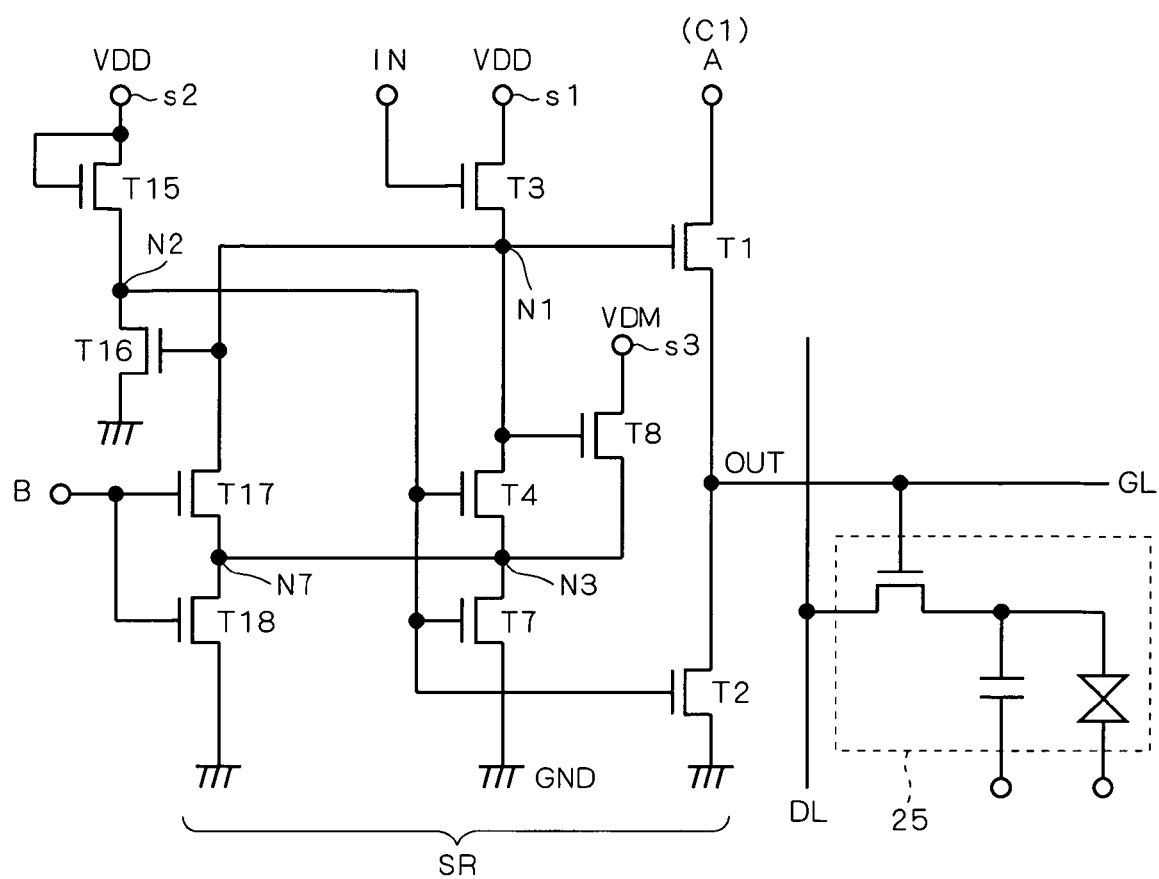
FIG. 23 is a circuit diagram illustrating the configuration of a unit shift register according to a variant of the tenth preferred embodiment.

Further, the circuit (formed by the third power terminal s3 and transistor T8) for applying the source voltage VDM to the node N3 and the circuit (formed by the eighth power terminal s8 and transistor T19) for applying the source voltage VDM to the node N7 are provided separately in the present embodiment. However, connecting the nodes N3 and N7 in common as shown in FIG. 23, only one circuit is required for applying the source voltage VDM to the nodes N3 and N7, achieving a reduction in circuit scale. In FIG. 23, the transistor T8 applies the voltage at the third power terminal s3 to both the nodes N3 and N7. The above-described operation is possible since the transistors T4, T7, T17 and T18 are all held off during a period in which the transistor T8 is held on (i.e., a period in which the node N1 is at VDD–Vth).

Eleventh Preferred Embodiment

Figure 24:
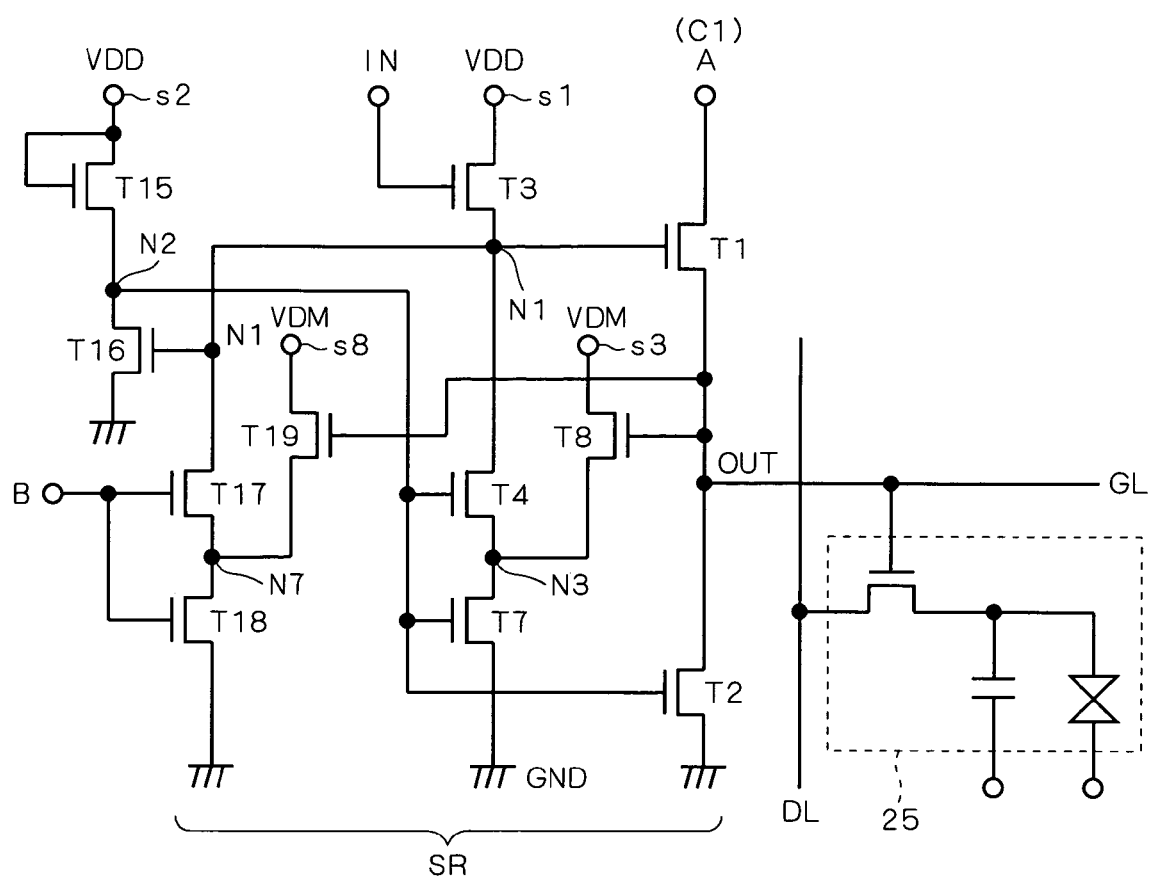
FIG. 24 is a circuit diagram illustrating the configuration of a unit shift register according to an eleventh preferred embodiment of the invention.

FIG. 24 is a circuit diagram illustrating the configuration of a unit shift register SR according to an eleventh preferred embodiment. In the tenth preferred embodiment, the transistors T8 and T19 for applying the voltage VDM to the nodes N3 and N7 have their gates connected to the node N1, however, the gates are connected to the output terminal OUT in the present embodiment. More specifically, the transistors T8 and T19 are turned on when the output terminal OUT transitions to VDD.

Therefore, in the present embodiment, the voltage VDM is applied to the nodes N3 and N7 only from time $t_4$ to time $t_5$ in the timing chart of FIG. 22. However, the nodes N3 and N7 are brought into the floating state from time $t_5$ to time $t_6$, and are kept at VDM in that period. That is, the transistors T4 and T17 are negative biased from time $t_4$ to time $t_6$ in the present embodiment, preventing a leakage current from occurring at the node N1.

Accordingly, the present embodiment achieves the effect obtained by the second preferred embodiment. That is, the effect of controlling a leakage current at the node N1 at almost the same level as in the first preferred embodiment. Further, the number of transistors connected to the node N1 is less than in the tenth preferred embodiment. Thus, the parasitic capacitance at the node N1 is reduced, achieving the effect of raising the node N1 in level by the clock signal input to the first clock terminal A with more efficiency.

Furthermore, although not shown, the nodes N3 and N7 may be connected in common in the present embodiment. In this case, only one circuit is required for applying the source voltage VDM to the nodes N3 and N7, achieving a reduction in circuit scale.

Twelfth Preferred Embodiment

Figure 25:
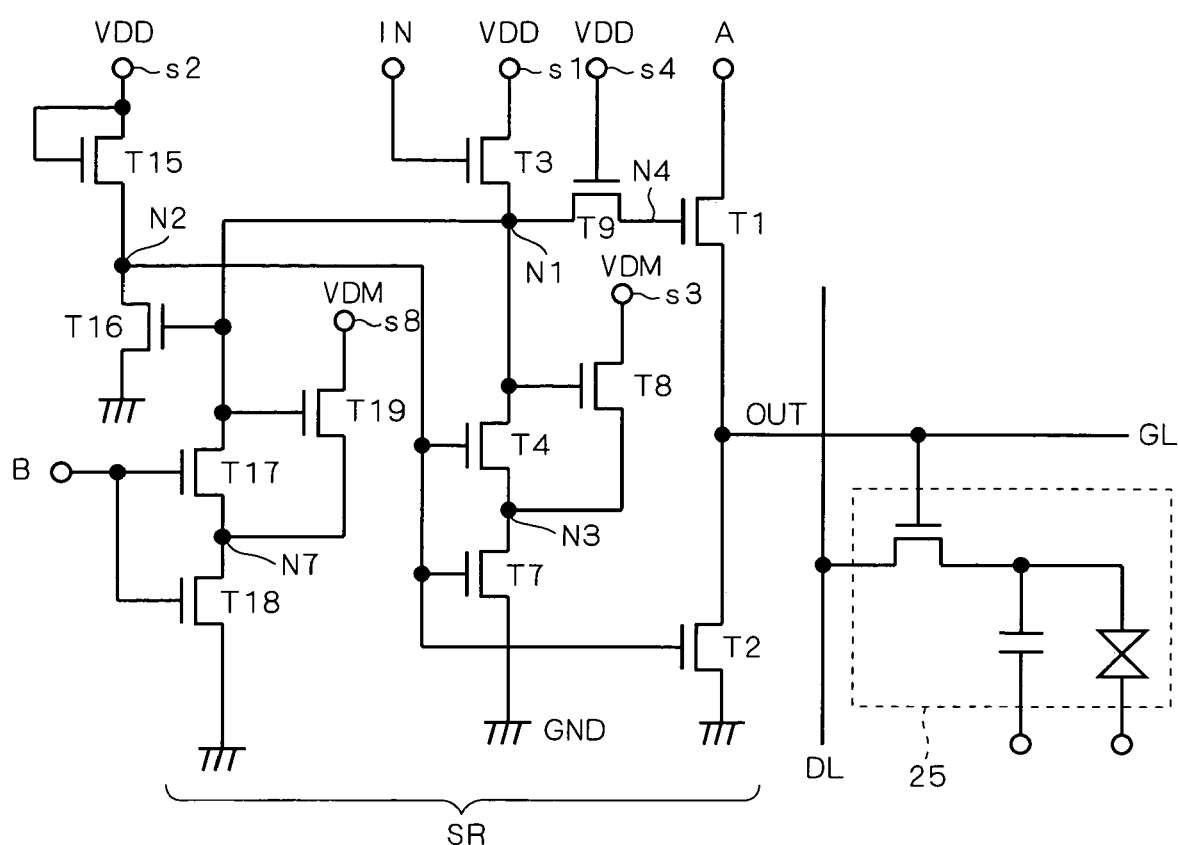
FIG. 25 is a circuit diagram illustrating the configuration of a unit shift register according to a twelfth preferred embodiment of the invention.

FIG. 25 is a circuit diagram illustrating the configuration of a unit shift register SR according to a twelfth preferred embodiment. The present embodiment applies the technique described in the third preferred embodiment to the unit shift register SR according to the tenth preferred embodiment. More specifically, the unit shift register SR according to the present embodiment is configured such that the gate of the transistor T1 (node N4) and node N1 of the circuit shown in FIG. 21 are connected via the transistor T9. The fourth power terminal s4 to which the gate of the transistor T9 is connected is connected to the power source VDD, similarly to the first and second power terminals s1 and s2.

In this unit shift register SR, the node N1 is set at the level determined by the source-follower operation of the transistor T9 during a period in which the gate of the transistor T1 (node N4) rises to 2×VDD–Vth (from time $t_4$ to time $t_5$ in the timing chart of FIG. 22). In FIG. 25, the gate voltage of the transistor T9 is at VDD, so that the node N1 is kept at VDD–Vth. Therefore, the drain-to-source voltage of the transistor T4 (the voltage between the nodes N1 and N3) and the drain-to-source voltage of the transistor T17 (the voltage between the nodes N1 and N7) are lower than in the tenth preferred embodiment, achieving an effect of further reducing a leakage current in the transistor T4 in that period.

In the present embodiment, the gate of the transistor T9, i.e., the fourth power terminal s4 is connected to the power source VDD, similarly to the first and second power terminals s1 and s2. However, any other power source that can set the node N1 at a value close to the level at the nodes N3 and N7 (VDM) by the source-follower operation of the transistor T9 may be used. In that case, similar effects as described above can also be achieved.

Thirteenth Preferred Embodiment

Figure 26:
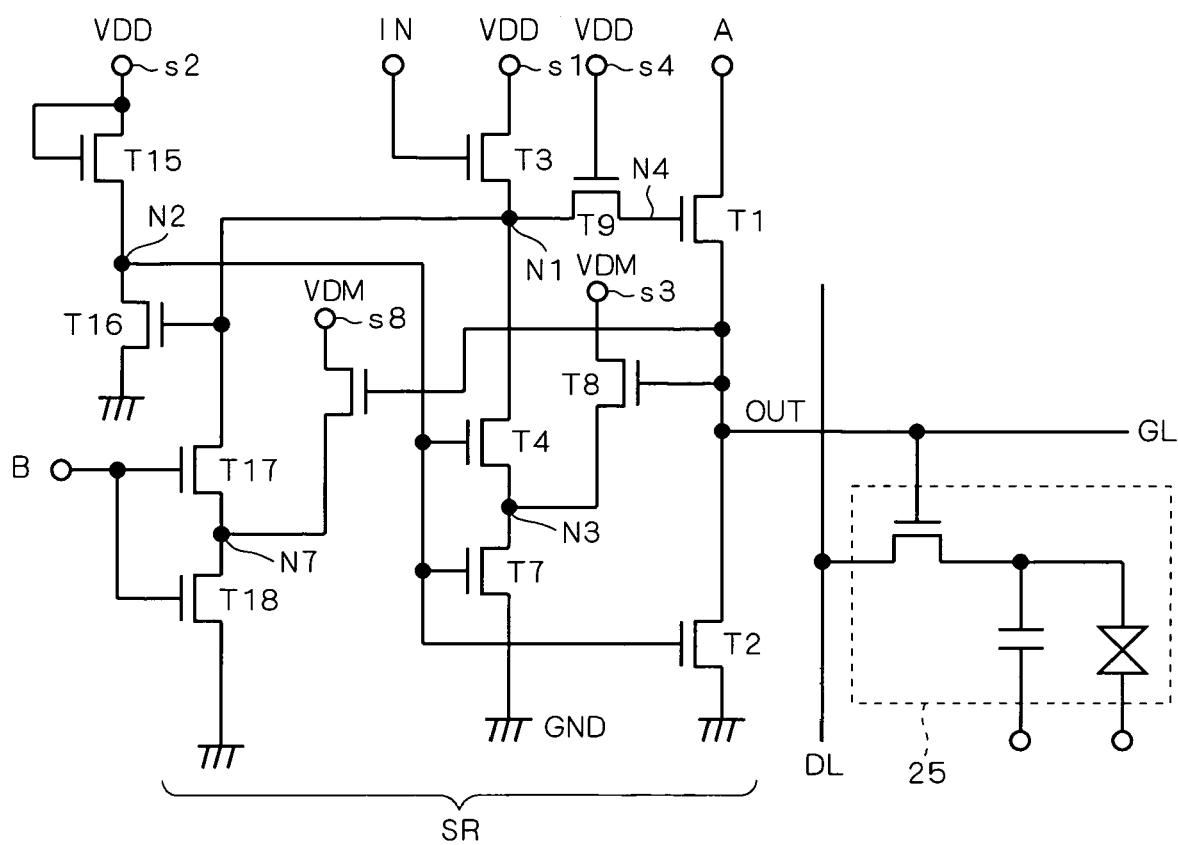
FIG. 26 is a circuit diagram illustrating the configuration of a unit shift register according to a thirteenth preferred embodiment of the invention.

FIG. 26 is a circuit diagram illustrating the configuration of a unit shift register SR according to a thirteenth preferred embodiment. The present embodiment is achieved by combining the eleventh and twelfth preferred embodiments. More specifically, the transistors T8 and T19 have their gates connected to the output terminal OUT, and the transistor T9 having its gate connected to the fourth power terminal s4 is interposed between the gate of the transistor T1 and node N1. In the present embodiment, the fourth power terminal s4 is connected to the power source VDD.

In the above twelfth preferred embodiment, seven transistors are connected to the node N1 as shown in FIG. 25, causing a concern about increasing the parasitic capacitance at the node N1. In the present embodiment, however, the transistors T8 and T19 are not connected to the node N1 by applying the eleventh preferred embodiment, so that the problem is solved. Further, similarly to the twelfth preferred embodiment, the node N1 is kept at VDD–Vth even when the node N4 rises to 2×VDD–Vth. Thus, the drain-to-source voltage of each of the transistors T4 and T19 at that time is reduced, achieving the effect of controlling leakage currents in the transistors T4 and T19.

Fourteenth Preferred Embodiment

Figure 27:
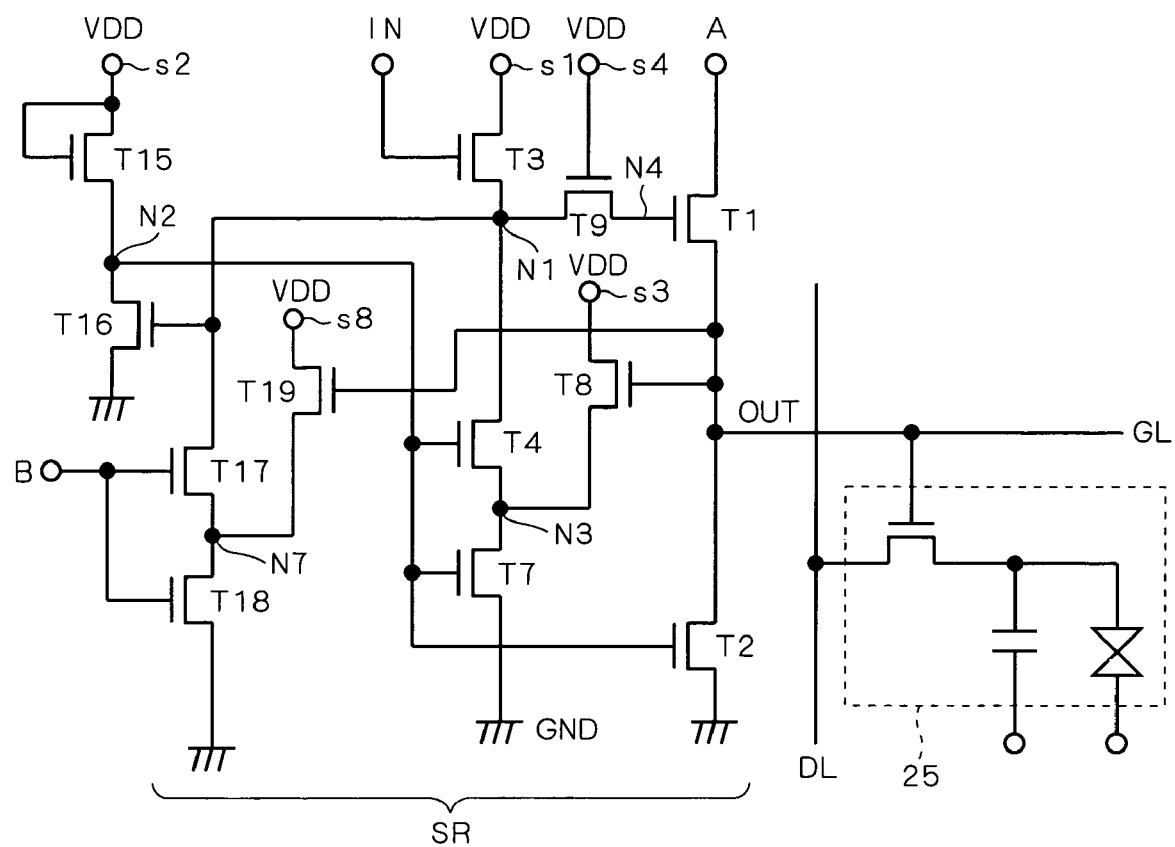
FIG. 27 is a circuit diagram illustrating the configuration of a unit shift register according to a fourteenth preferred embodiment of the invention.

FIG. 27 is a circuit diagram illustrating the configuration of a unit shift register SR according to a fourteenth preferred embodiment. The unit shift register SR is configured such that the power source VDD is connected to the third and eighth power terminals s3 and s8, similarly to the first and fourth power terminals s1 and s4, by applying the fifth preferred embodiment to the circuit according to the thirteenth preferred embodiment (FIG. 26).

Since the power source VDD is connected to the fourth power terminal s4 to which the gate of the transistor T9 is connected, the node N1 is kept at VDD–Vth even when the node N4 rises to 2×VDD–Vth, similarly to the thirteenth preferred embodiment. Further, since the power source VDD is connected to the third and eighth power terminals s3 and s8, the node N3 also transitions to VDD–Vth at that time. In other words, the drain-to-source voltage of each of the transistors T4 and T17 transitions to approximately 0V, so that no leakage current flows between the drain and source of each of the transistors T4 and T17. As a result, the effect of preventing the node N4, i.e., the gate of the transistor T1 from dropping in level is obtained.

In the present embodiment, the power source VDD is connected to the third, fourth and eighth power terminals s3, s4 and s8 to avoid an increase in the number of power sources, however, any other power source may be used that can set the nodes N1, N4 and N7 at almost the same value when the node N1 rises in level.

Fifteenth Preferred Embodiment

For instance, the unit shift register SR according to the first preferred embodiment is configured as shown in FIG. 3 such that the transistor T4 is negative biased using the power source VDM connected to the third power terminal s3 and transistors T7 and T8, thereby controlling the leakage current at the node N1. The present embodiment will propose a unit shift register SR capable of bringing the transistor T4 into the negative-biased state without using these components.

Figure 28:
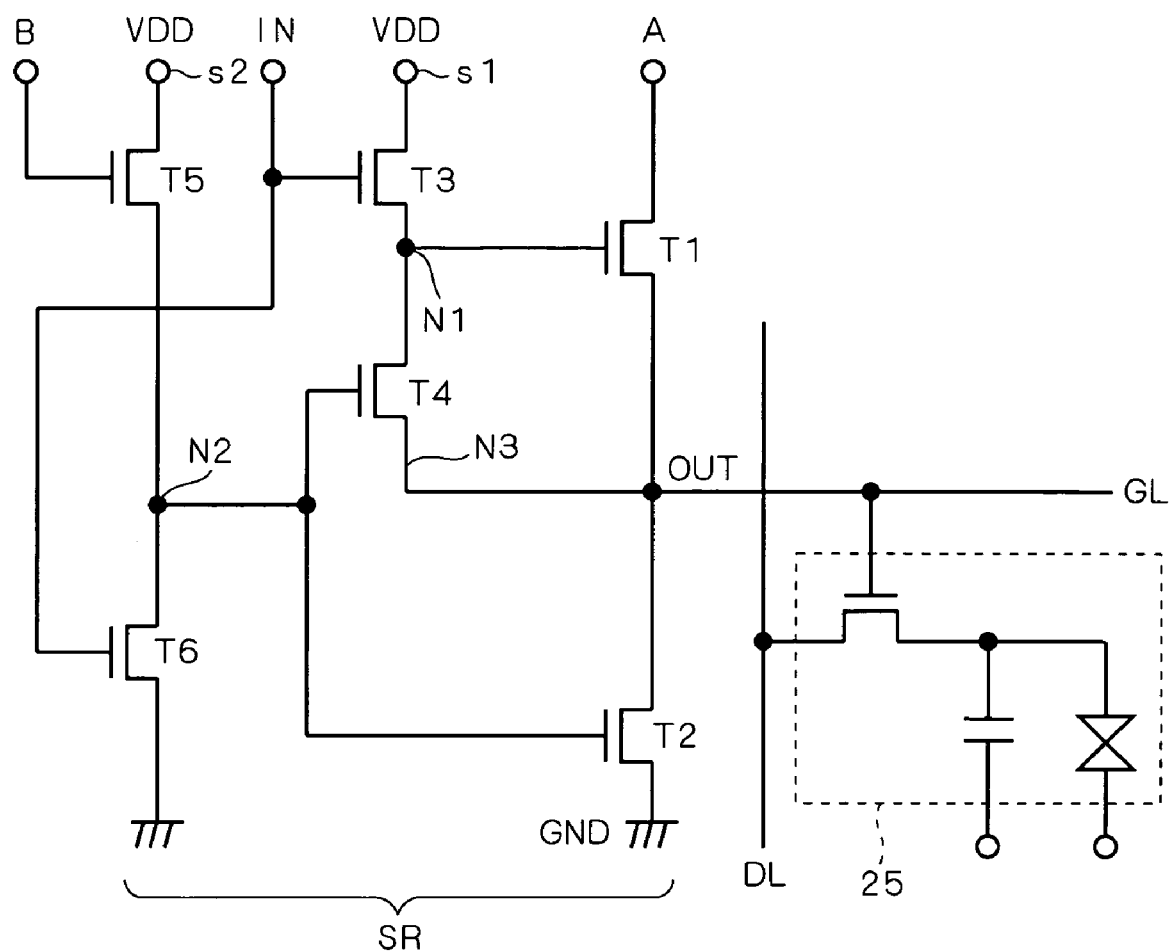
FIG. 28 is a circuit diagram illustrating the configuration of a unit shift register according to a fifteenth preferred embodiment of the invention.

FIG. 28 is a circuit diagram illustrating the configuration of a unit shift register SR according to a fifteenth preferred embodiment. In the present embodiment, the node N3, i.e., the source of the transistor T4 is connected to the output terminal OUT. As described above, the third power terminal s3 (power source VDM) and transistors T7 and T8 shown in FIG. 3 are not required in this circuit.

As seen from FIG. 3, the transistors T2 and T7 are switched on/off with the same timing as their sources are both connected to the ground GND and their gates are connected to the node N2. Therefore, a normal operation can be performed similarly to the circuit shown in FIG. 3 by connecting the transistor T2 (in place of transistor T7) between the node N3 and ground GND, as shown in FIG. 28.

However, in the unit shift register SR shown in FIG. 28, the node N3 is connected to the output terminal OUT, so that the node N3 also transitions to VDD when the output terminal OUT transitions to VDD. In other words, the unit shift register according to the present embodiment operates such that the node N3 transitions to VDD during a period from time $t_4$ to time $t_5$ in the timing chart of FIG. 4. Accordingly, the transistor T4 is negative biased in that period, which can control the leakage current at the node N1.

Referring to the timing chart shown in FIG. 4, the period during which the leakage current at the node N1 should be prevented is from time $t_4$ at which the transistor T3 is turned off with the node N1 being charged to time $t_5$ at which the clock signal C1 input to the first clock terminal A falls, however, the leakage current tends to occur particularly from time $t_4$ to time $t_5$ during which the node N1 rises to 2×VDD–Vth. Therefore, the effect of controlling the leakage current at the node N1 at almost the same level as in the first preferred embodiment is obtained even with the circuitry of the present embodiment in which the transistor T4 is negative biased only from time $t_4$ to time $t_5$.

Further, in the present embodiment, the number of required transistors and power sources is less than in the first preferred embodiment, achieving a reduction in circuit scale. The number of transistors connected to the node N1 is also less than in the first preferred embodiment, so that the parasitic capacitance at the node N1 is reduced. This can achieve an effect of raising the node N1 in level by the clock signal input to the first clock terminal A with more efficiency.

Sixteenth Preferred Embodiment

Figure 29:
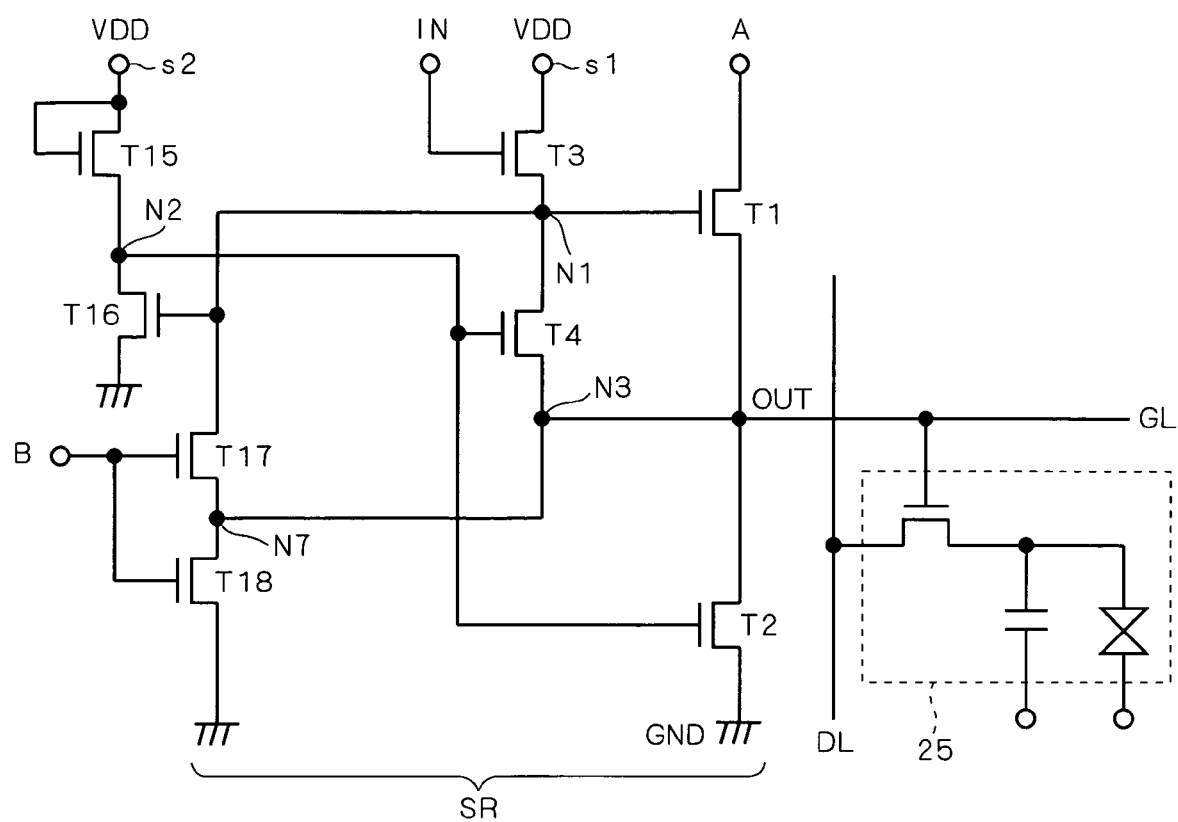
FIG. 29 is a circuit diagram illustrating the configuration of a unit shift register according to a sixteenth preferred embodiment of the invention.

FIG. 29 is a circuit diagram illustrating the configuration of a unit shift register SR according to a sixteenth preferred embodiment. The present embodiment applies the technique described in the fifteenth preferred embodiment to the unit shift register SR according to the tenth preferred embodiment.

In the present embodiment, the node N3 (the source of the transistor T4) and the node N7 (the connection node between the transistors T17 and T18) are both connected to the output terminal OUT. The third and eighth power terminals s3 and s8 (power source VDM) and transistors T7, T8 and T19 shown in FIG. 21 are not required.

Connecting the transistor T2 (in place of the transistor T7) between the node N3 and ground GND arises no problem in the operation, as described in the fifteenth preferred embodiment.

On the other hand, paying attention to the behaviors of the transistors T2, T17 and T18 in the normal operation of the unit shift register SR shown in FIG. 22, the transistor T2 is also turned on when the transistors T17 and T18 are turned on, and the transistors T17 and T18 are turned off when the transistor T2 is turned off to cause the output terminal OUT to transition to VDD. Therefore, connecting the node N7 to the output terminal OUT arises no problem in the operation.

In the normal operation, the node N1 needs to be set 0V in response to the clock signal input to the second clock terminal B, so that the transistor T18 cannot be omitted. This is because, although being connected between the node N1 and ground GND, the transistor T2 is first turned on when the node N1 drops in level to turn on the transistor T16 and to raise the node N2 in level, as described in the tenth preferred embodiment, so that the node N1 cannot be discharged substantially via the transistor T2.

In the unit shift register SR shown in FIG. 29, the nodes N3 and N7 are connected to the output terminal OUT, and thus transition to VDD when the output terminal OUT transitions to VDD. More specifically, the unit shift register SR according to the present embodiment operates such that the nodes N3 and N7 transition to VDD between time $t_4$ and time $t_5$ in the timing chart shown in FIG. 4. Therefore, the transistors T4 and T17 are negative biased in that period, which controls the leakage current at the node N1.

Referring to the timing chart shown in FIG. 22, the period during which the leakage current at the node N1 should be prevented is from time $t_4$ at which the transistor T3 is turned off with the node N1 being charged to time $t_5$ at which the clock signal C1 input to the first clock terminal A falls, however, the leakage current tends to occur particularly from time $t_4$ to time $t_5$ during which the node N1 rises to 2×VDD−Vth. This achieves an effect of controlling the leakage current at the node N1 at almost the same level as in the fifteenth preferred embodiment even with the circuitry of the present embodiment in which the transistors T4 and T7 are negative biased only from time $t_4$ to time $t_5$.

Further, in the present embodiment, the number of required transistors and power sources is less than in the tenth preferred embodiment, achieving a reduction in circuit scale. The number of transistors connected to the node N1 is also less than in the tenth preferred embodiment, so that the parasitic capacitance at the node N1 is reduced. This achieves an effect of raising the node N1 in level by the clock signal input to the first clock terminal A with more efficiency.

Seventeenth Preferred Embodiment

In a display apparatus, there is a possibility that noise from the data line DL due to coupling caused by the parasitic capacitance between the gate line GL and data line DL, for example, may be added to the output terminal OUT of the unit shift register SR in the non-selective state of the gate line GL.

For instance, in the unit shift register SR according to the fifteenth preferred embodiment (FIG. 28), the node N2 is at VDD−Vth in the non-selective state of the gate line GL, so that the transistor T4 is on. When noise from the gate line GL is added to the output terminal OUT at that time, the noise is transmitted to the node N1 via the transistor T4. If the transistor T1 is thereby turned on, a corresponding gate line GL is activated though not being selected, which may cause a malfunction of failing to achieve a normal display.

Figure 30:
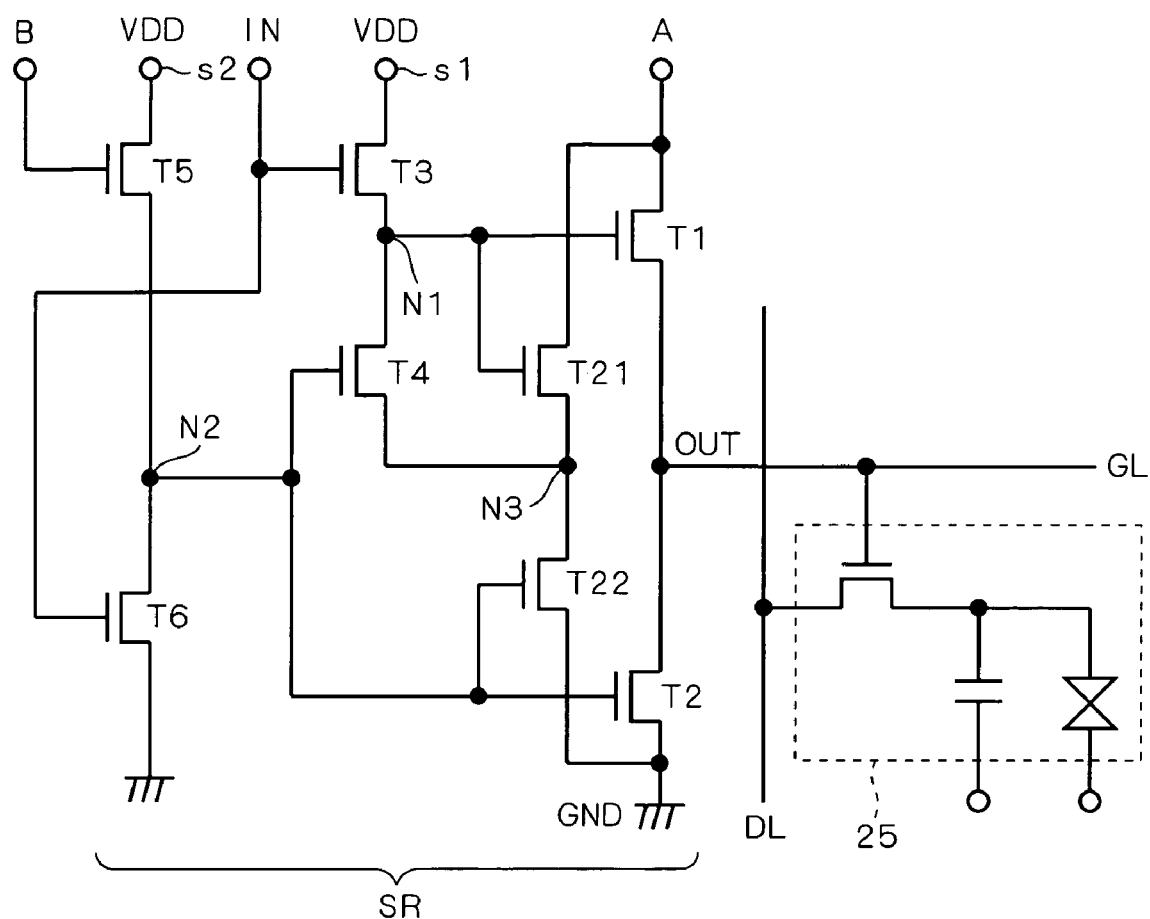
FIG. 30 is a circuit diagram illustrating the configuration of a unit shift register according to a seventeenth preferred embodiment of the invention.

FIG. 30 is a circuit diagram illustrating the configuration of a unit shift register SR according to a seventeenth preferred embodiment. As shown, the node N3 is not connected to the output terminal OUT in the unit shift register SR.

A transistors T21 is connected between the node N3 and first clock terminal A, and a transistor T22 is connected between the node N3 and ground GND (reference voltage terminal). More specifically, the pair of transistors T21 and T22 and that of the transistors T1 and T2 are connected in parallel to each other. The transistor T21 has its gate connected to the node N1, similarly to the transistor T1, and the transistor T22 has its gate connected to the node N2, similarly to the transistor T2. Except this configuration, the unit shift register SR of the present embodiment is configured similarly to that shown in FIG. 28.

The transistors T21 and T22 carry out the same operation as the transistors T1 and T2, respectively, so that the node N3 and output terminal OUT transition in level just in the same way. As a result, the unit shift register SR shown in FIG. 30 carries out the same operation as the unit shift register SR according to the fifteenth preferred embodiment. More specifically, in the present embodiment, the transistor T4 is negative biased from time $t_4$ to time $t_5$ in the timing chart shown in FIG. 4, which controls the leakage current at the node N1.

In the present embodiment, however, the output terminal OUT and node N3 are separated, different from the fifteenth preferred embodiment. Therefore, noise, if added from the gate line GL to the output terminal OUT, is prevented from being transmitted to the node N1, which can avoid the above-mentioned malfunction.

Eighteenth Preferred Embodiment

The present embodiment applies the technique described in the seventeenth preferred embodiment to the unit shift register SR according to the sixteenth preferred embodiment (FIG. 29).

Figure 31:
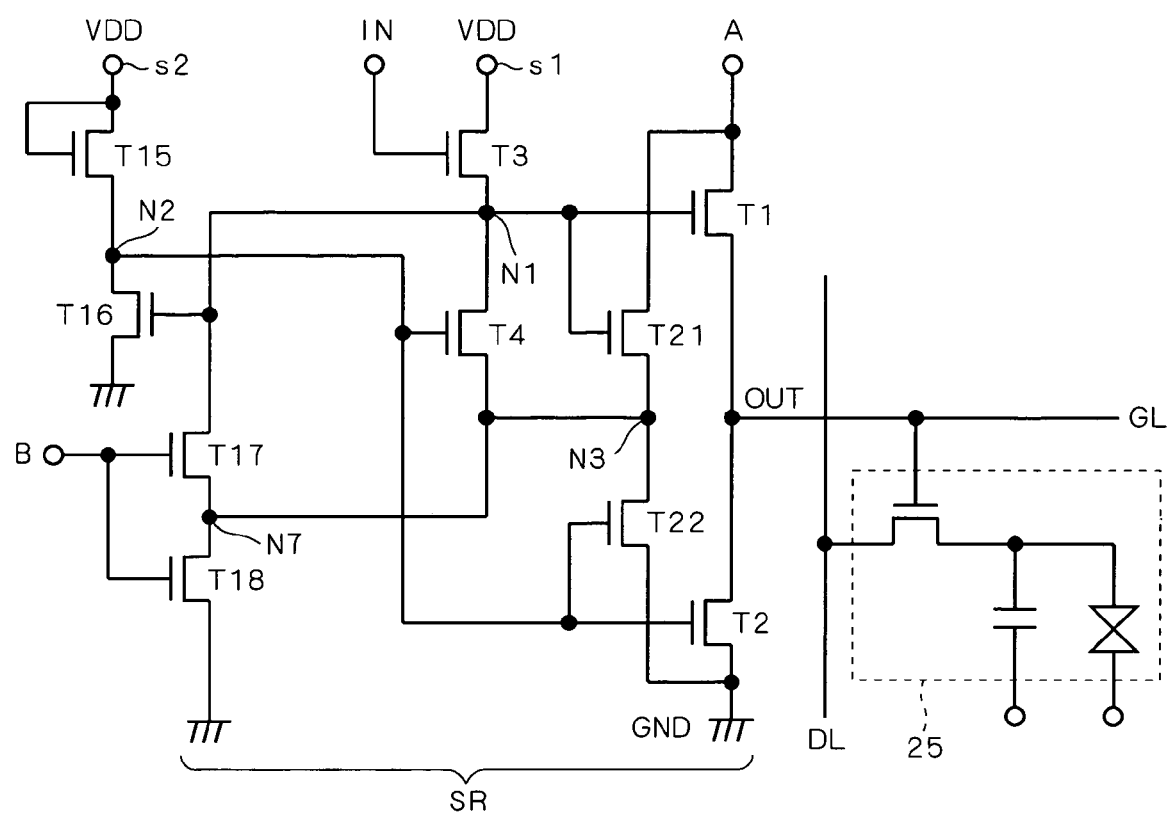
FIG. 31 is a circuit diagram illustrating the configuration of a unit shift register according to an eighteenth preferred embodiment of the invention.

FIG. 31 is a circuit diagram illustrating the configuration of a unit shift register SR according to an eighteenth preferred embodiment. As shown, in the unit shift register SR, the node N3 and output terminal OUT are not connected.

Similarly to the seventeenth preferred embodiment, the transistor T21 having its gate connected to the node N1 is connected between the node N3 and first clock terminal A, and the transistor T22 having its gate connected to the node N2 is connected between the node N3 and ground GND (reference voltage terminal). Except this configuration, the unit shift register SR of the present embodiment is configured similarly to that shown in FIG. 29.

The transistors T21 and T22 carry out the same operation as the transistors T1 and T2, respectively, so that the node N3 and output terminal OUT transition in level just in the same way. As a result, the unit shift register SR shown in FIG. 31 carries out the same operation as the unit shift register SR according to the sixteenth preferred embodiment. More specifically, in the present embodiment, the transistor T4 is negative biased from time $t_4$ to time $t_5$ in the timing chart shown in FIG. 4, which controls the leakage current at the node N1.

In the present embodiment, however, the output terminal OUT and node N3 are separated, different from the sixteenth preferred embodiment. Therefore, the above-mentioned malfunction caused by noise added from the gate line GL to the output terminal OUT can be avoided.

While the invention has been shown and described in detail, the foregoing description is in all aspects illustrative and not restrictive. It is therefore understood that numerous modifications and variations can be devised without departing from the scope of the invention.

What is claimed is:

1. A shift register comprising:

an input terminal and an output terminal;

first and second clock terminals to which first and second clock signals are input, respectively, said first and second clock signals being shifted in phase from each other;

first, second and third voltage terminals to which first, second and third voltages are applied, respectively;

a first transistor connected between said output terminal and said first clock terminal;

a second transistor connected between said output terminal and said first voltage terminal;

a first node to which a control electrode of said first transistor is connected;

a second node to which a control electrode of said second transistor is connected; and a driving section for applying said first voltage to said first node and a voltage corresponding to said third voltage to said second node in synchronization with said second clock signal, while applying a voltage corresponding to said second voltage to said first node and said first voltage to said second node in response to an input signal input to said input terminal, wherein said driving section includes a compensation circuit for charging said second node to a level at which a conducting state of said second transistor is kept in synchronization with said first clock signal during a period in which said second transistor is in the conducting state.

2. The shift register according to claim 1, wherein said compensation circuit includes:

fourth and fifth voltage terminals to which predetermined fourth and fifth voltages are applied, respectively;

a third transistor connected between said second node and said fourth voltage terminal;

a fourth transistor connected between a control electrode of said third transistor and said second node, having a control electrode connected to said fifth voltage terminal; and a capacitive element connected between said control electrode of said third transistor and said first clock terminal.

3. The shift register according to claim 2, wherein said capacitive element is a metal oxide semiconductor capacitive element.

4. A shift register comprising a plurality of shift registers connected in cascade, each being defined in claim 1.

5. An image display apparatus using said shift register defined in claim 1 as a scanning-line driving circuit.

* * * * *